(12) United States Patent
Kobayashi et al.

(10) Patent No.: US 10,622,303 B2
(45) Date of Patent: Apr. 14, 2020

(54) SEMICONDUCTOR DEVICE HAVING A STACKED BODY INCLUDING A FIRST STACKED PORTION AND A SECOND STACKED PORTION

(71) Applicant: Toshiba Memory Corporation, Minato-ku (JP)

(72) Inventors: Shigeki Kobayashi, Kuwana (JP); Masaru Kito, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/862,665

(22) Filed: Jan. 5, 2018

(65) Prior Publication Data

US 2019/0006275 A1   Jan. 3, 2019

(30) Foreign Application Priority Data

Jun. 28, 2017   (JP) .................................. 2017-126448

(51) Int. Cl.
| | |
|---|---|
| *H01L 27/11582* | (2017.01) |
| *H01L 23/528* | (2006.01) |
| *H01L 21/768* | (2006.01) |
| *H01L 27/11556* | (2017.01) |
| *H01L 27/11565* | (2017.01) |
| *H01L 27/11575* | (2017.01) |
| *H01L 27/1157* | (2017.01) |

(52) U.S. Cl.
CPC ...... *H01L 23/528* (2013.01); *H01L 21/76802* (2013.01); *H01L 21/76877* (2013.01); *H01L 27/1157* (2013.01); *H01L 27/11556* (2013.01); *H01L 27/11565* (2013.01); *H01L 27/11575* (2013.01); *H01L 27/11582* (2013.01)

(58) Field of Classification Search
CPC ......... H01L 27/11582; H01L 27/11575; H01L 27/11556; H01L 21/76802; H01L 21/76877; H01L 27/11565; H01L 27/1157
See application file for complete search history.

(56) References Cited

U.S. PATENT DOCUMENTS

| | | | |
|---|---|---|---|
| 9,184,177 B2 | 11/2015 | Imamura et al. | |
| 9,343,405 B2 * | 5/2016 | Matsuda | ............... H01L 23/528 |
| 9,356,038 B2 | 5/2016 | Lee et al. | |
| 10,026,746 B2 * | 7/2018 | Lee | .......................... G11C 16/08 |

(Continued)

FOREIGN PATENT DOCUMENTS

JP   2014-138188   7/2014

*Primary Examiner* — Khiem D Nguyen
(74) *Attorney, Agent, or Firm* — Oblon, McClelland, Maier & Neustadt, L.L.P.

(57) ABSTRACT

According to one embodiment, a stacked body includes a plurality of conductive layers stacked with an insulator interposed. The stacked body includes a first stacked portion and a second stacked portion. The second stacked portion includes a plurality of terrace portions arranged in a staircase configuration with level differences in a first direction and a second direction. The second stacked portion includes a conductive portion and a spacer portion. The conductive portion is connected to the conductive layer and is provided in same layer as the conductive layer. The spacer portion is provided in same layer as the conductive layer and the conductive portion. The spacer portion is of a material different from the conductive portion.

10 Claims, 32 Drawing Sheets

(56) References Cited

U.S. PATENT DOCUMENTS

| | | | |
|---|---|---|---|
| 2009/0212350 A1* | 8/2009 | Kidoh | H01L 27/0688 257/324 |
| 2010/0309729 A1* | 12/2010 | Chang | H01L 21/28282 365/185.28 |
| 2011/0244666 A1* | 10/2011 | Kim | H01L 27/11551 438/478 |
| 2012/0132983 A1* | 5/2012 | Fukuzumi | H01L 27/11565 257/324 |
| 2013/0032874 A1* | 2/2013 | Ko | H01L 29/7926 257/324 |
| 2013/0056818 A1* | 3/2013 | Iino | H01L 27/1157 257/324 |
| 2014/0197546 A1 | 7/2014 | Hwang et al. | |
| 2015/0001613 A1* | 1/2015 | Yip | H01L 27/115 257/329 |
| 2015/0061068 A1* | 3/2015 | Akutsu | H01L 21/76877 257/499 |
| 2015/0115455 A1* | 4/2015 | Chen | H01L 21/76895 257/773 |
| 2015/0255484 A1* | 9/2015 | Imamura | H01L 27/11582 257/314 |
| 2015/0340374 A1* | 11/2015 | Jung | H01L 27/11573 438/258 |
| 2016/0268297 A1* | 9/2016 | Murakami | H01L 27/11582 |
| 2017/0179025 A1* | 6/2017 | Yun | H01L 21/76816 |
| 2018/0166454 A1* | 6/2018 | Pyon | H01L 27/11286 |

* cited by examiner

US 10,622,303 B2

SEMICONDUCTOR DEVICE HAVING A STACKED BODY INCLUDING A FIRST STACKED PORTION AND A SECOND STACKED PORTION

CROSS-REFERENCE TO RELATED APPLICATION

This application is based upon and claims the benefit of priority from Japanese Patent Application No. 2017-126448, filed on Jun. 28, 2017; the entire contents of which are incorporated herein by reference.

FIELD

Embodiments described herein relate generally to a semiconductor device and a method for manufacturing a semiconductor device.

BACKGROUND

In a three-dimensional memory device, a contact structure for connecting multiple conductive layers to a control circuit has been proposed in which, for example, the multiple conductive layers are patterned into a staircase configuration. Also, a method for forming the three-dimensional memory device has been proposed in which a stacked body is formed by alternately stacking sacrificial layers and insulating layers, and the sacrificial layers are subsequently replaced with conductive layers.

DETAILED DESCRIPTION

Figure 1:
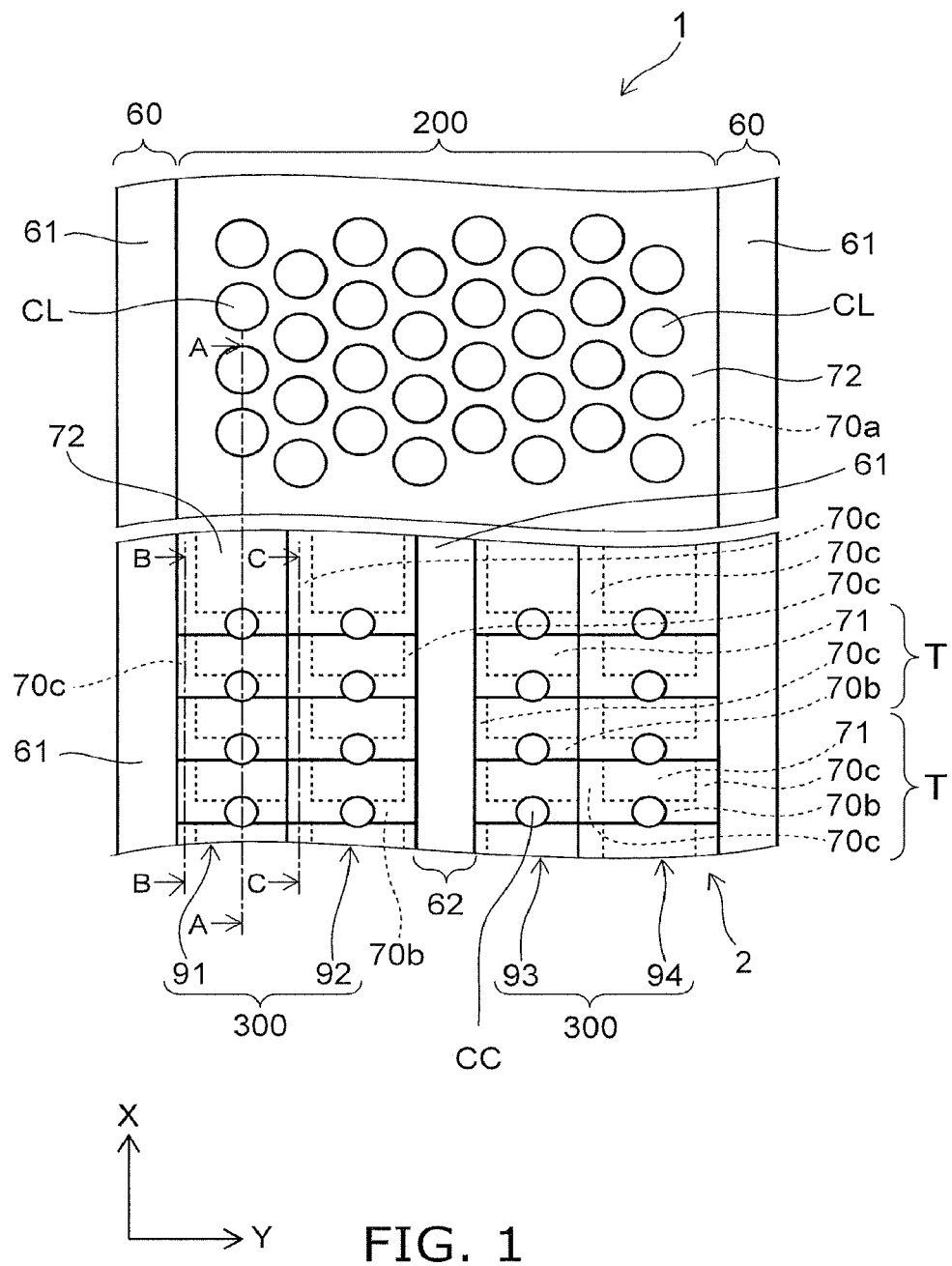
FIG. 1 is a schematic plan view of a semiconductor device of an embodiment.

According to one embodiment, a semiconductor device includes a stacked body and a columnar portion. The stacked body includes a plurality of conductive layers stacked with an insulator interposed. The stacked body includes a first stacked portion and a second stacked portion. The second stacked portion includes a plurality of terrace portions arranged in a staircase configuration with level differences in a first direction and a second direction. The second direction crosses the first direction. The columnar portion extends in a stacking direction of the stacked body through the first stacked portion. One of the terrace portions in the second stacked portion includes a conductive portion and a spacer portion. The conductive portion is connected to a conductive layer of the first stacked portion and is provided in same layer as the conductive layer. The conductive layer is one layer of the conductive layers. The spacer portion is provided in same layer as the conductive layer and the conductive portion. The spacer portion is of a material different from the conductive portion.

Embodiments will now be described with reference to the drawings. The same components in the drawings are marked with the same reference numerals.

In an embodiment, for example, a semiconductor memory device that includes a memory cell array having a three-dimensional structure is described as a semiconductor device.

FIG. 1 is a schematic plan view of the semiconductor device of the embodiment.

The semiconductor device of the embodiment includes a memory cell array 1 and a staircase portion 2. The memory cell array 1 includes multiple columnar portions CL; and the staircase portion 2 includes multiple terrace portions T.

Figure 2:
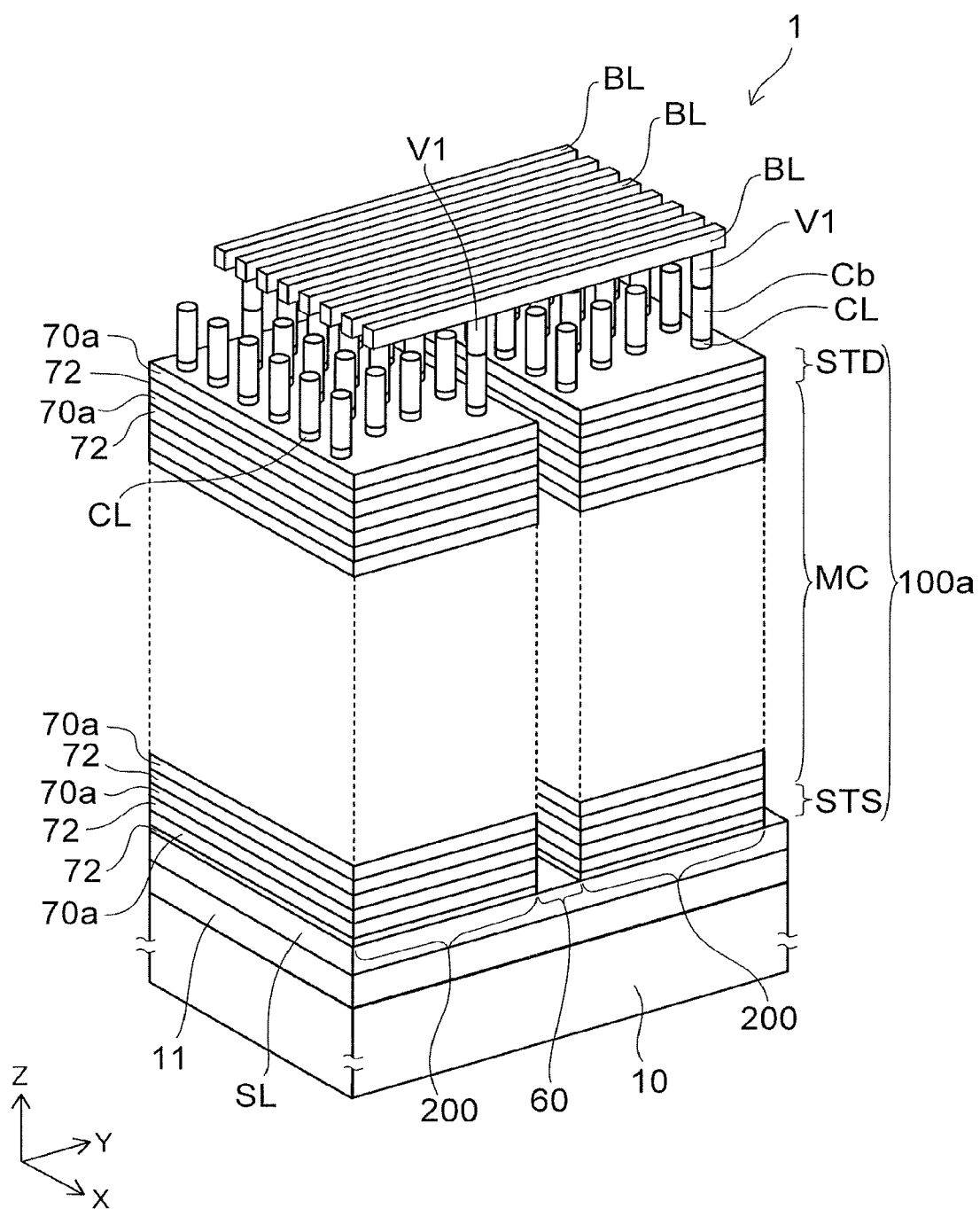
FIG. 2 is a schematic perspective view of a memory cell array of the embodiment.

FIG. 2 is a schematic perspective view of the memory cell array 1.

Figure 3:
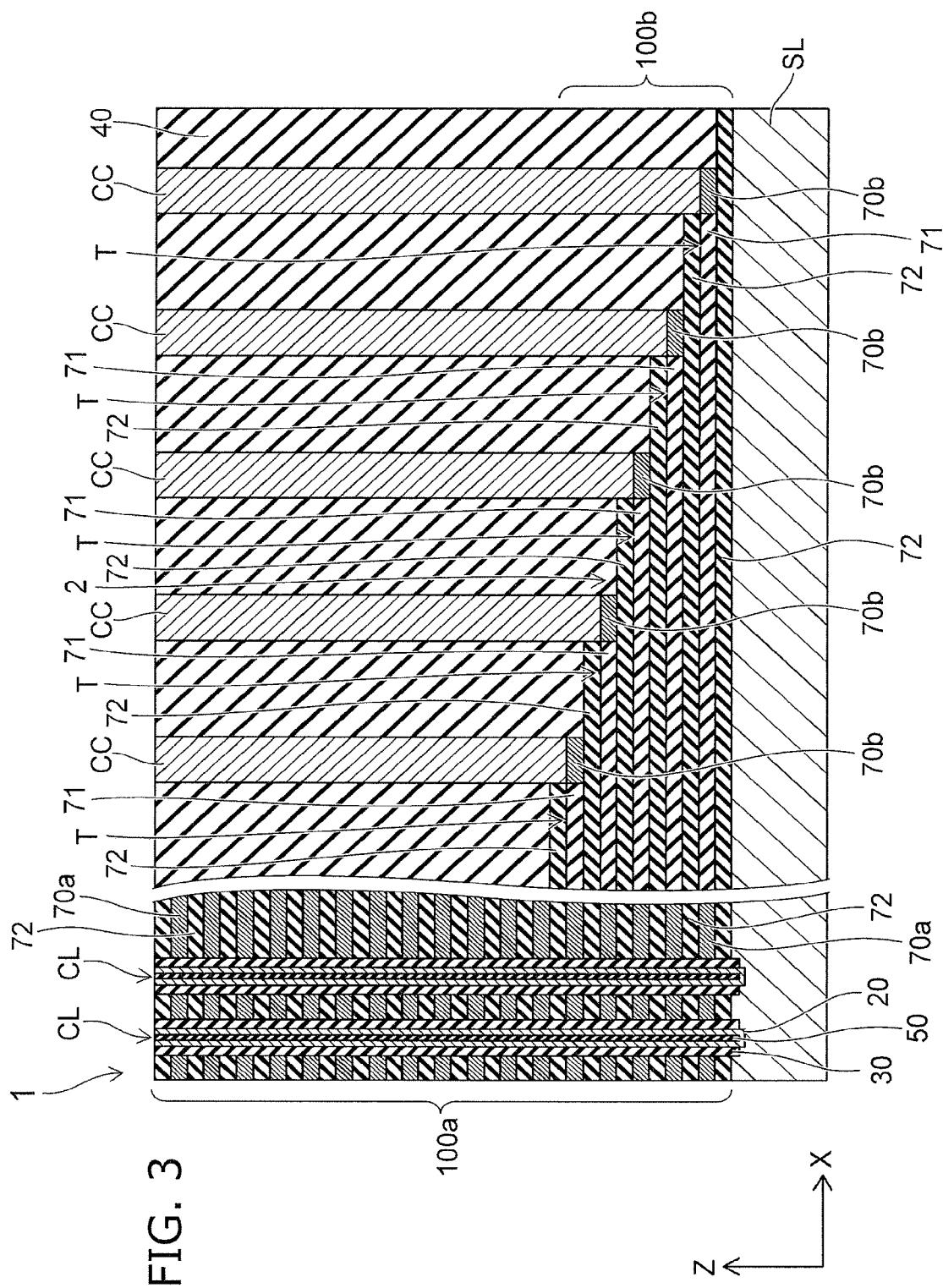
FIG. 3 is an A-A cross-sectional view of FIG. 1.

FIG. 3 is an A-A cross-sectional view of FIG. 1.

In FIG. 2, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 2.

A circuit layer 11 and a source layer SL are provided on the substrate 10. The circuit layer 11 is provided between the substrate 10 and the source layer SL, and includes, for example, a CMOS circuit. The source layer SL includes a semiconductor layer (e.g., a polycrystalline silicon layer doped with an impurity). Or, the source layer SL includes a layer including a metal (a metal layer or a metal silicide layer). Or, the source layer SL has a stacked structure of a semiconductor layer and a layer including a metal.

The substrate 10 and the circuit layer 11 are not illustrated in FIG. 3 and subsequent drawings.

As shown in FIG. 3, the memory cell array 1 includes a first stacked portion 100a provided on the source layer SL used as a foundation layer. The staircase portion 2 is formed in a second stacked portion 100b.

In the example shown in FIG. 3, the source layer SL is provided below the second stacked portion 100b. The source layer SL may not be provided below the second stacked portion 100b.

As shown in FIG. 2, the memory cell array 1 includes the first stacked portion 100a, the multiple columnar portions CL, and multiple separation portions 60. For example, bit lines BL are provided as upper layer interconnects above the first stacked portion 100a.

The columnar portions CL are formed in substantially circular columnar configurations extending in the stacking direction (the Z-direction) through the first stacked portion 100a. The separation portions 60 spread in the X-direction and the stacking direction of the first stacked portion 100a (the Z-direction), and divide the first stacked portion 100a into multiple blocks (or fingers) 200 in the Y-direction.

For example, the multiple columnar portions CL have a staggered arrangement. Or, the multiple columnar portions CL may have a square lattice arrangement along the X-direction and the Y-direction.

The multiple bit lines BL are, for example, metal films extending in the Y-direction. The multiple bit lines BL are separated from each other in the X-direction. The upper ends of semiconductor bodies 20 of the columnar portions CL described below are connected to the bit lines BL via contacts Cb and contacts V1 shown in FIG. 2.

As shown in FIG. 3, the first stacked portion 100a includes multiple conductive layers 70a stacked on the source layer SL. The multiple conductive layers 70a are stacked in a direction (the Z-direction) perpendicular to the major surface of the substrate 10 (shown in FIG. 2) with insulating layers 72 interposed as insulators. The insulating layer 72 is provided also between the source layer SL and the conductive layer 70a of a lowermost layer.

The conductive layer 70a is, for example, silicon doped with an impurity, or a layer including a metal as a major component. The insulating layer 72 is, for example, a silicon oxide layer.

Figure 6A:
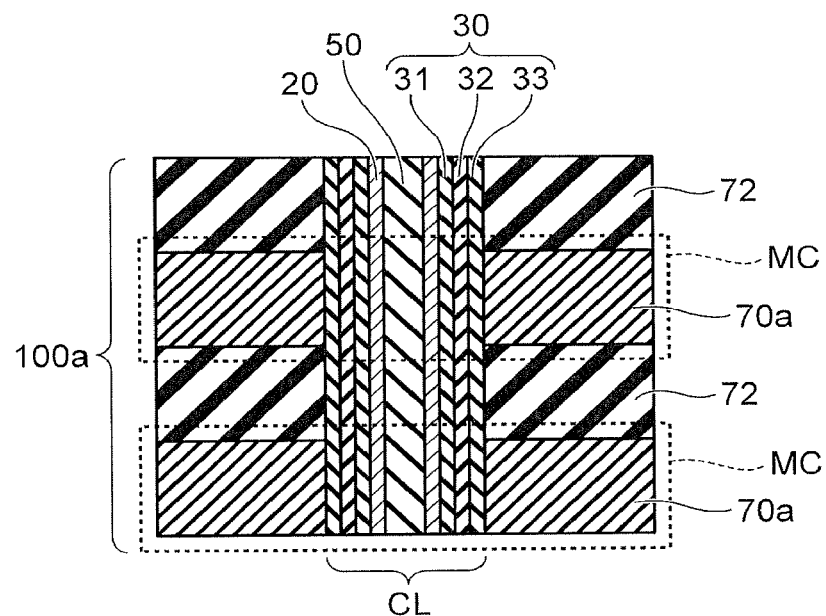
FIG. 6A is a schematic cross-sectional view of a memory cell of the embodiment.

FIG. 6A is an enlarged schematic cross-sectional view of the vicinity of the columnar portion CL.

The columnar portion CL includes a memory film 30, the semiconductor body 20, and an insulative core film 50. The semiconductor body 20 extends to be continuous in a pipe-like configuration in the stacking direction (the Z-direction) through the first stacked portion 100a. The memory film 30 is provided between the semiconductor body 20 and the conductive layers 70a, and surrounds the semiconductor body 20 from the outer perimeter side. The core film 50 is provided on the inner side of the semiconductor body 20 having the pipe-like configuration.

The memory film 30 is a stacked film including a tunneling insulating film 31, a charge storage film (a charge storage portion) 32, and a blocking insulating film 33. The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the conductive layers 70a.

The semiconductor body 20, the memory film 30, and the conductive layer 70a are included in a memory cell MC. The memory cell MC has a vertical transistor structure in which the conductive layer 70a surrounds the periphery of the semiconductor body 20 with the memory film 30 interposed.

In the memory cell MC that has the vertical transistor structure, the semiconductor body 20 is, for example, a channel body of silicon; and the conductive layer 70a functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the conductive layer 70a. Also, the blocking insulating film 33 prevents back-tunneling of the charge from the conductive layer 70a into the columnar portion CL.

The blocking insulating film 33 includes, for example, a silicon oxide film. Or, the blocking insulating film 33 may be a stacked film of a silicon oxide film and a metal oxide film (e.g., an aluminum oxide film). The silicon oxide film is provided between the charge storage film 32 and the metal oxide film; and the metal oxide film is provided between the silicon oxide film and the conductive layer 70a.

As shown in FIG. 2, a drain-side selection transistor STD is provided in the upper layer portion of the first stacked portion 100a. A source-side selection transistor STS is provided in the lower layer portion of the first stacked portion 100a. The drain-side selection transistor STD and the source-side selection transistor STS each include the semiconductor body 20 that functions as a channel. The semiconductor body 20 of the memory cell MC is electrically connected to the semiconductor body 20 of the drain-side selection transistor STD and the semiconductor body 20 of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected electrically in series via the semiconductor body 20 and are included in one memory string. For example, the memory strings have a staggered arrangement in a planar direction parallel to the X-Y plane; and the multiple memory cells MC are provided three-dimensionally in the X-direction, the Y-direction, and the Z-direction.

As shown in FIG. 1, the separation portion 60 includes an insulating film 61. The insulating film 61 is not illustrated in FIG. 2. Or, the separation portion 60 may include an interconnect portion that is a film including, for example, a metal, and spreading in the X-direction and the Z-direction.

As shown in FIG. 3, the lower end portions of the semiconductor bodies 20 contact the source layer SL.

The staircase portion 2 formed in the second stacked portion 100b will now be described.

As shown in FIG. 1 and FIG. 3, the staircase portion 2 includes the multiple terrace portions T. The multiple terrace portions T are arranged in a staircase configuration with level differences in the two directions of the X-direction and the Y-direction.

The separation portion 60 dividing the first stacked portion 100a into the multiple blocks 200 extends to the region where the second stacked portion 100b including the multiple terrace portions T is formed as shown in FIG. 1. A separation portion 62 is further provided in the region where the second stacked portion 100b is formed. The separation portion 62 is not provided in the region where the first stacked portion 100a is formed.

Similar to the separation portion 60, the separation portion 62 also is formed from the insulating film 61. The separation portion 60 and the separation portion 62 pierce the second stacked portion 100b and extend in the X-direction. The separation portion 60 and the separation portion 62 are arranged alternately in the Y-direction in the region where the second stacked portion 100b is formed.

The second stacked portion 100b is divided into multiple blocks (or fingers) 300 in the Y-direction by the separation portions 60 and 62 which are more numerous than the separation portions 60 dividing the first stacked portion 100a.

The pitch in the Y-direction of the multiple separation portions 60 and 62 in the region where the second stacked portion 100b is formed is smaller than the pitch in the Y-direction of the multiple separation portions 60 in the memory cell array 1. The width in the Y-direction of one block 300 is narrower than the width in the Y-direction of one block 200 in the memory cell array 1.

One block 300 that is partitioned by the separation portions 60 and 62 includes the two columns of a first column 91 or 93 and a second column 92 or 94. The block 300 on the left side in FIG. 1 includes the first column 91 and the second column 92. The block 300 on the right side in FIG. 1 includes the first column 93 and the second column 94.

The first column 91 of the block 300 on the left side in FIG. 1 is disposed between the separation portion 60 and the second column 92, and is adjacent to the separation portion 60 and the second column 92. The second column 92 of the block 300 on the left side is disposed between the first column 91 and the separation portion 62, and is adjacent to the first column 91 and the separation portion 62.

The first column 93 of the block 300 on the right side in FIG. 1 is disposed between the separation portion 62 and the second column 94, and is adjacent to the separation portion 62 and the second column 94. The second column 94 of the block 300 on the right side is disposed between the first column 93 and the separation portion 60, and is adjacent to the first column 93 and the separation portion 60.

Figure 4A:
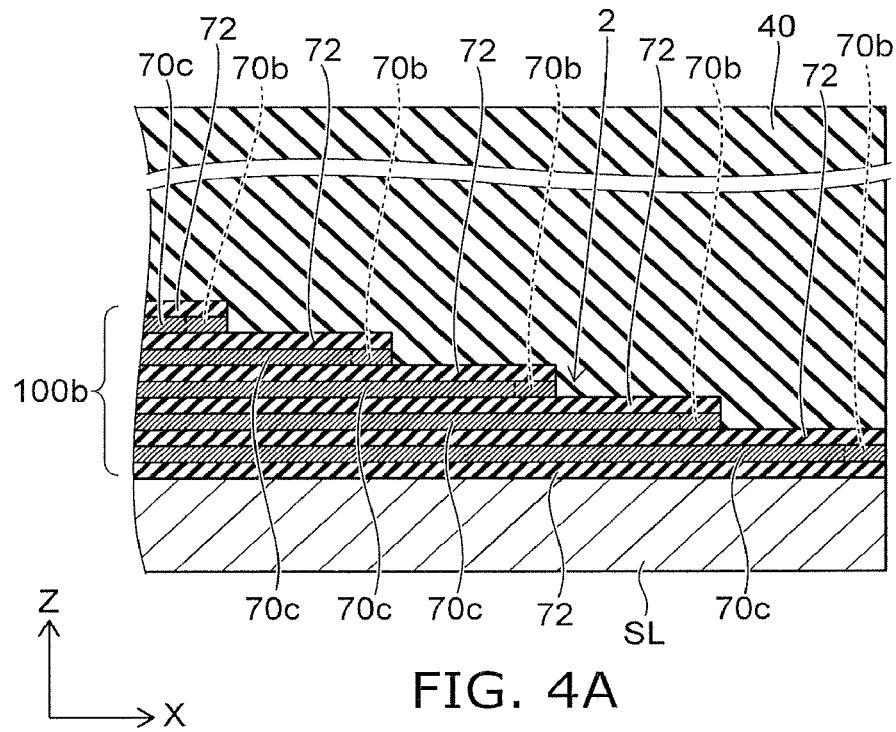
FIG. 4A is a B-B cross-sectional view of FIG. 1.

FIG. 4A is a B-B cross-sectional view of FIG. 1 and illustrates the cross section of the second stacked portion 100b including the first column 91 at the vicinity of the boundary with the separation portion 60.

Figure 4B:
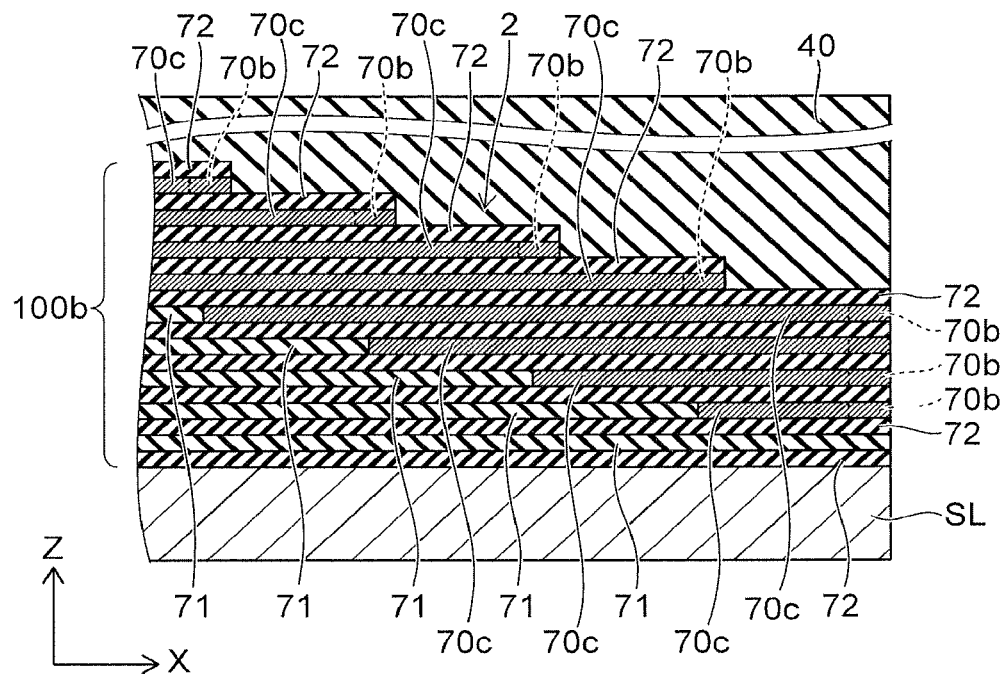
FIG. 4B is a C-C cross-sectional view of FIG. 1.

FIG. 4B is a C-C cross-sectional view of FIG. 1 and illustrates the cross section of the second stacked portion 100b including the second column 92 at the vicinity of the boundary with the first column 91.

Figure 5:
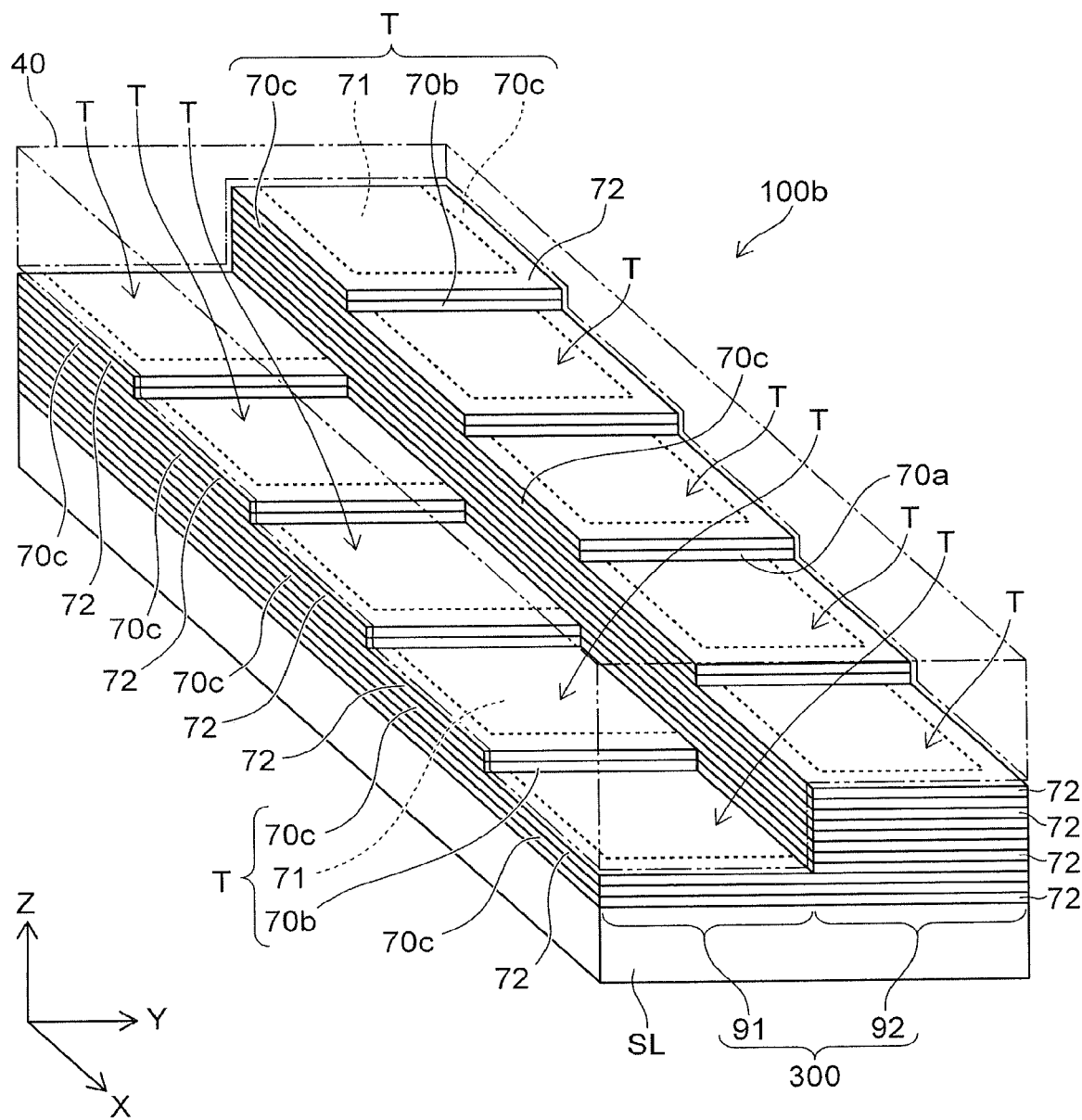
FIG. 5 is a schematic perspective view of a second stacked portion including a plurality of terrace portions of the embodiment.

FIG. 5 is a schematic perspective view of the block 300 including the first column 91 and the second column 92.

The first column 91 and the second column 92 each include multiple (e.g., five) terrace portions T arranged in staircase configurations with level differences in the X-direction. Also, the first column 93 and the second column 94 each include multiple (e.g., five) terrace portions T arranged in staircase configurations with level differences in the X-direction. The first column 91, the second column 92, the first column 93, and the second column 94 include the same number of terrace portions T.

Figure 6B:
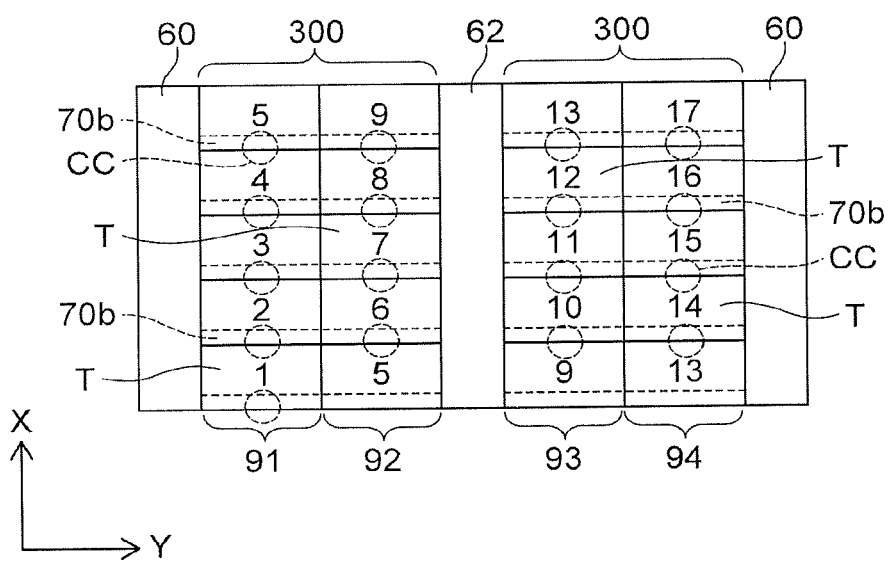
FIG. 6B is a schematic plan view of the terrace portions of the embodiment.

FIG. 6B is a schematic plan view of the multiple terrace portions T.

The numerals that mark the terrace portions T in FIG. 6B illustrate the level numbers of the terrace portions T counting from the terrace portion T of the lowermost level (the terrace portion T of the first level). The terrace portion T of the first level is the terrace portion of the layer (the level) most proximal to the substrate 10. The larger numerals illustrate the terrace portions T of the higher layers (levels).

The level difference changes one level at a time from the first level to the fifth level for the five terrace portions T of the first column 91.

The level difference changes one level at a time from the fifth level to the ninth level for the five terrace portions T of the second column 92.

The level difference changes one level at a time from the ninth level to the thirteenth level for the five terrace portions T of the first column 93.

The level difference changes one level at a time from the thirteenth level to the seventeenth level for the five terrace portions T of the second column 94.

A level difference is formed also between the columns adjacent to each other in the Y-direction. The level difference between the columns adjacent to each other in the Y-direction is larger than the level difference between the terrace portions T adjacent to each other in the X-direction for each of the columns 91 to 94.

The terrace portions T of the second column 92 are disposed in levels equal to or higher than the uppermost level of the first column 91 inside the same block 300 as the second column 92. The terrace portions T of the second column 94 are disposed in levels equal to or higher than the uppermost level of the first column 93 inside the same block 300 as the second column 94.

The terrace portions T from the fifth level to the ninth level of the second column 92 are disposed in levels equal to or higher than the uppermost level (the fifth level) of the first column 91. The terrace portions T from the thirteenth level to the seventeenth level of the second column 94 are disposed in levels equal to or higher than the uppermost level (the thirteenth level) of the first column 93.

The terrace portions T from the ninth level to the thirteenth level of the first column 93 are disposed in levels equal to or higher than the uppermost level (the ninth level) of the second column 92 of the adjacent block 300. In the example shown in FIG. 6B, the level difference changes four levels at a time for the multiple terrace portions T adjacent to each other in the Y-direction.

The terrace portion T of the lowermost level (the fifth level) of the second column 92 is positioned in the same level as the terrace portion T of the uppermost level (the fifth level) of the first column 91. The terrace portion T of the lowermost level (the thirteenth level) of the second column 94 is positioned in the same level as the terrace portion T of the uppermost level (the thirteenth level) of the first column 93. In FIG. 6B, the terrace portion T of the lowermost level (the ninth level) of the first column 93 of the block 300 on the right side is positioned in the same level as the terrace portion T of the uppermost level (the ninth level) of the second column 92 of the block 300 on the left side.

As shown in FIG. 1 and FIG. 5, the second stacked portion 100b includes a first conductive portion 70b, a second conductive portion 70c, and a spacer portion 71. The first conductive portion 70b, the second conductive portion 70c, and the spacer portion 71 are provided in the same layer as the layer of the first stacked portion 100a where the conductive layer 70a is provided.

As shown in FIG. 3 and FIGS. 4A and 4B, in the second stacked portion 100b, the insulating layer 72 and the layer where the first conductive portion 70b, the second conductive portion 70c, and the spacer portion 71 are provided are stacked alternately. The insulating layer 72 of the second stacked portion 100b is provided as one body of the same material (e.g., silicon oxide) as the insulating layer 72 of the first stacked portion 100a.

The terrace portion T includes the first conductive portion 70b, the second conductive portion 70c, and the spacer portion 71. The terrace portion T is formed in the same layer as the conductive layer 70a of the memory cell array 1; and the upper surface of the terrace portion T is covered with the insulating layer 72.

The thickness of the conductive layer 70a is substantially equal to the thickness of the first conductive portion 70b, the thickness of the second conductive portion 70c, and the thickness of the spacer portion 71.

The first conductive portion 70b is provided at the X-direction end of the terrace portion T. The second conductive portion 70c extends in the X-direction along the Y-direction edge of the terrace portion T, and connects the first conductive portion 70b and the conductive layer 70a of the first stacked portion 100a. One end portion of the second conductive portion 70c extending in the X-direction is connected to the first conductive portion 70b provided at the tip of the terrace portion T; and the other end portion is connected to the conductive layer 70a of the first stacked portion 100a. The first conductive portion 70b and the second conductive portion 70c are connected in an L-shaped configuration in a plan view when the staircase portion 2 is viewed from above in the Z-direction.

The conductive layer 70a, the first conductive portion 70b, and the second conductive portion 70c are provided to be continuous as one body of the same material. The conductive layer 70a, the first conductive portion 70b, and the second conductive portion 70c are, for example, a metal layer including mainly tungsten.

As shown in FIG. 1, the first column 91 of the block 300 on the left side includes one second conductive portion 70c provided at the boundary with the separation portion 60. The second conductive portion 70c is adjacent to the separation portion 60.

The second column 92 adjacent to the first column 91 includes two second conductive portions 70c provided at the boundary with the separation portion 62 and the boundary with the first column 91. The second conductive portion 70c on the separation portion 62 side of the second column 92 is adjacent to the separation portion 62.

The first column 93 of the block 300 on the right side includes one second conductive portion 70c provided at the boundary with the separation portion 62. The second conductive portion 70c is adjacent to the separation portion 62.

The second column 94 adjacent to the first column 93 includes two second conductive portions 70c provided at the boundary with the separation portion 60 and the boundary with the first column 93. The second conductive portion 70c on the separation portion 60 side of the second column 94 is adjacent to the separation portion 60.

The first conductive portion 70b and the second conductive portion 70c are provided in an L-shaped configuration along the corner of the terrace portion T; and the terrace portions T of the first columns 91 and 93 each include one L-shaped conductive portion. The terrace portions T of the second columns 92 and 94 each include two L-shaped conductive portions combined to have line symmetry with respect to an axis along the X-direction. The spacer portion 71 is provided on the inner side of the first conductive portion 70b and the second conductive portion 70c forming the L-shape.

The spacer portion 71 is an insulating portion. The spacer portion 71 is a layer of a material different from the first conductive portion 70b, the second conductive portion 70c, and the insulating layer 72 and is, for example, a silicon nitride layer.

In the first stacked portion 100a, the entire space between the insulating layers 72 adjacent to each other above and below is the conductive layer 70a. Conversely, in the second stacked portion 100b, the first conductive portion 70b, the second conductive portion 70c, and the spacer portion 71 are provided in the space between the insulating layers 72 adjacent to each other above and below.

The conductive layer 70a spreads in the region where the multiple columnar portions CL are disposed and changes into a layer made of the second conductive portion 70c and the spacer portion 71 from a region (a region where the columnar portions CL are not disposed) partway through the layer in which the conductive layer 70a is provided. The layer that is made of the second conductive portion 70c and the spacer portion 71 further extends in the X-direction; and the first conductive portion 70b is provided to be continuous with the second conductive portion 70c at the X-direction end (the end of the terrace portion T).

The volume (the planar surface area) of the conductive layer 70a of one layer spreading in the first stacked portion 100a is greater than the total volume (the planar surface area) of the first conductive portion 70b and the second conductive portion 70c of the same layer as the conductive layer 70a.

As shown in FIG. 3 and FIGS. 4A and 4B, an inter-layer insulating film 40 is provided on the staircase portion 2 of the second stacked portion 100b. In FIG. 5, the inter-layer insulating film 40 is illustrated by a double dot-dash line. The separation portion 60 and the separation portion 62 that are formed in the second stacked portion 100b also pierce the inter-layer insulating film 40 and divide the inter-layer insulating film 40 in the Y-direction.

As shown in FIG. 3, multiple contacts CC extending in the Z-direction are provided inside the inter-layer insulating film 40. The contacts CC pierce the inter-layer insulating film 40 and the insulating layers 72, and reach the terrace portions T. The lower end portions of the multiple contacts CC respectively contact the corresponding first conductive portions 70b of the multiple terrace portions T.

The contacts CC are conductive bodies including a metal; and the contacts CC are connected respectively to not-illustrated upper layer interconnects. The upper layer interconnects are electrically connected to a control circuit formed in the circuit layer 11 shown in FIG. 2 via not-illustrated contacts. The conductive layers 70a of the memory cell array 1 are electrically connected to the contacts CC via the second conductive portions 70c and the first conductive portions 70b.

A method for manufacturing the semiconductor device of the embodiment will now be described with reference to FIG. 7 to FIG. 32B.

FIG. 7 to FIG. 10 are schematic perspective views showing processes for the first column 91 and the second column 92.

FIG. 11A to FIG. 17B are schematic plan views similar to FIG. 1.

Figure 18:
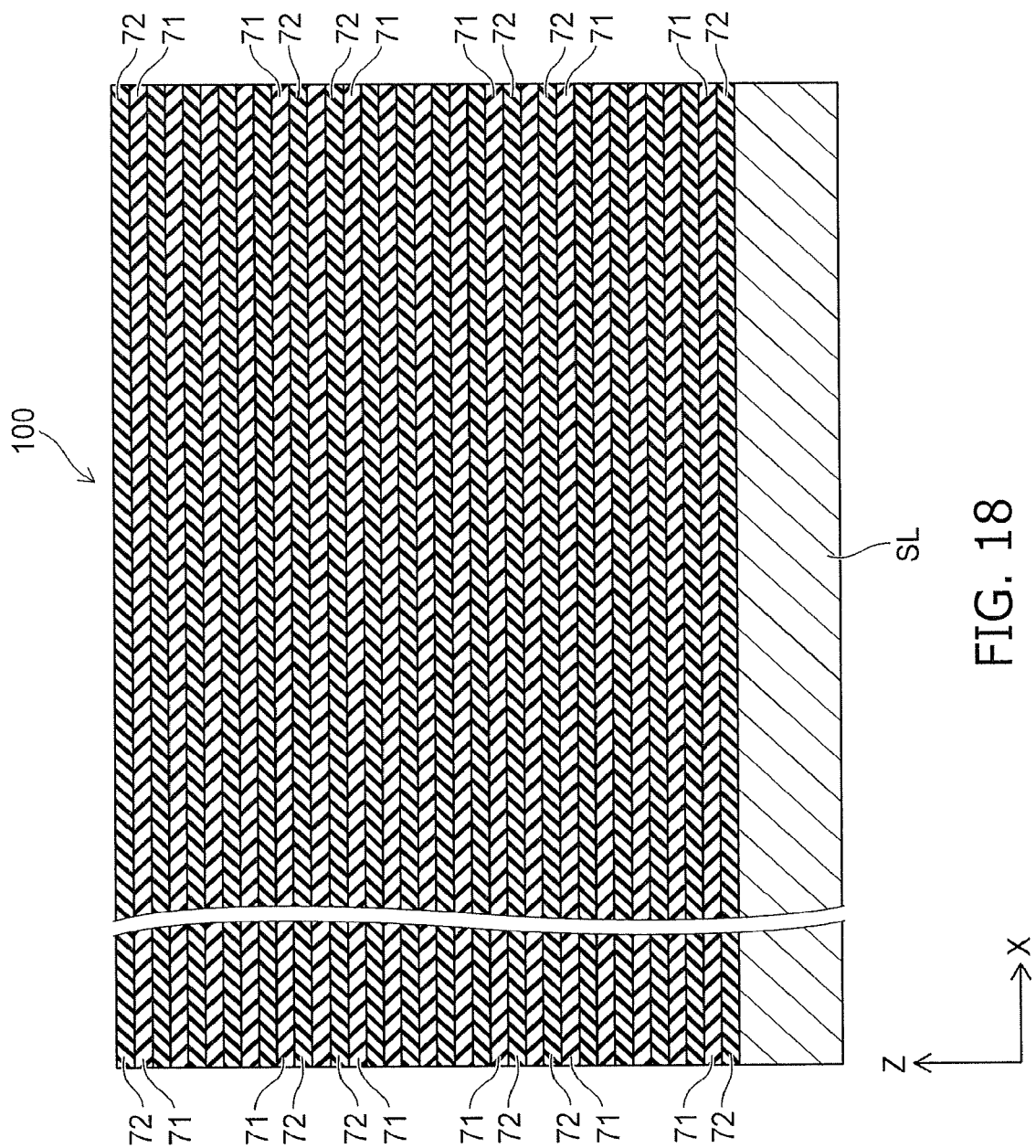
FIG. 18 to FIG. 33B are schematic cross-sectional views showing a method for manufacturing the semiconductor device of the embodiment.
Figure 19:
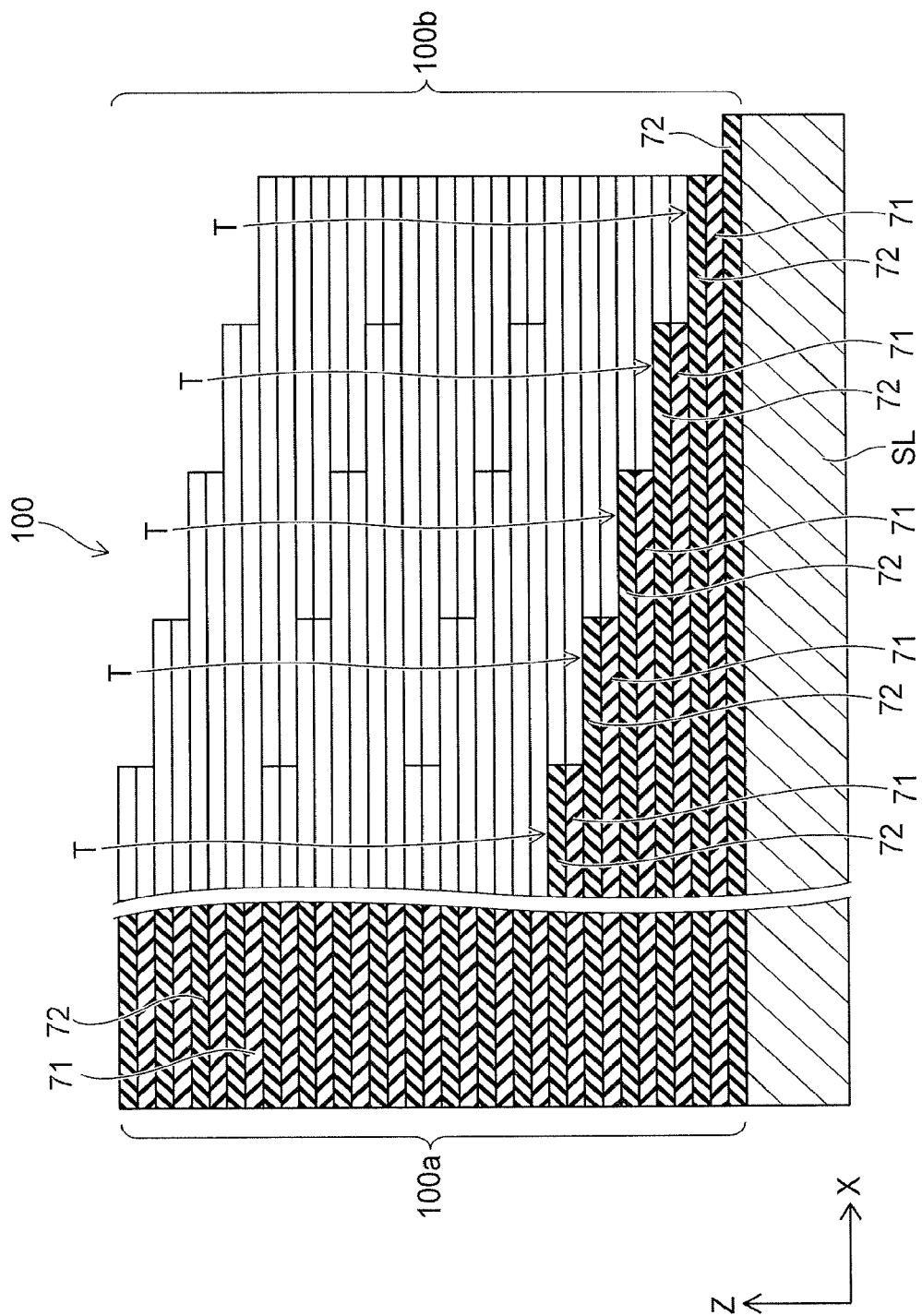
Figure 20:
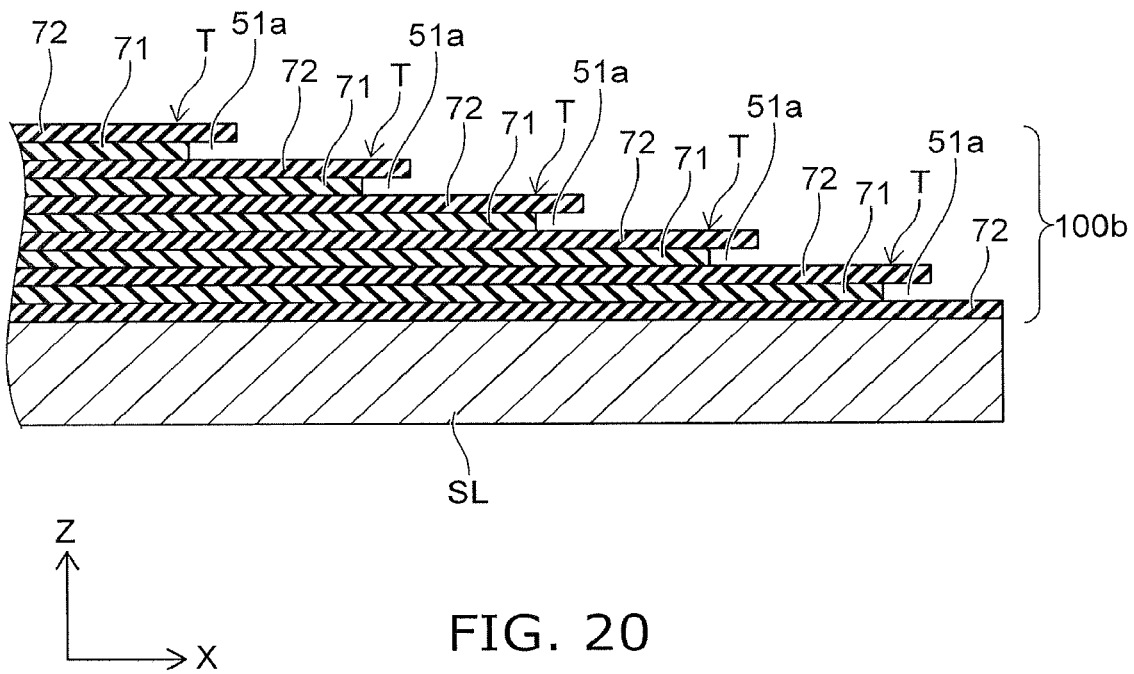
Figure 21:
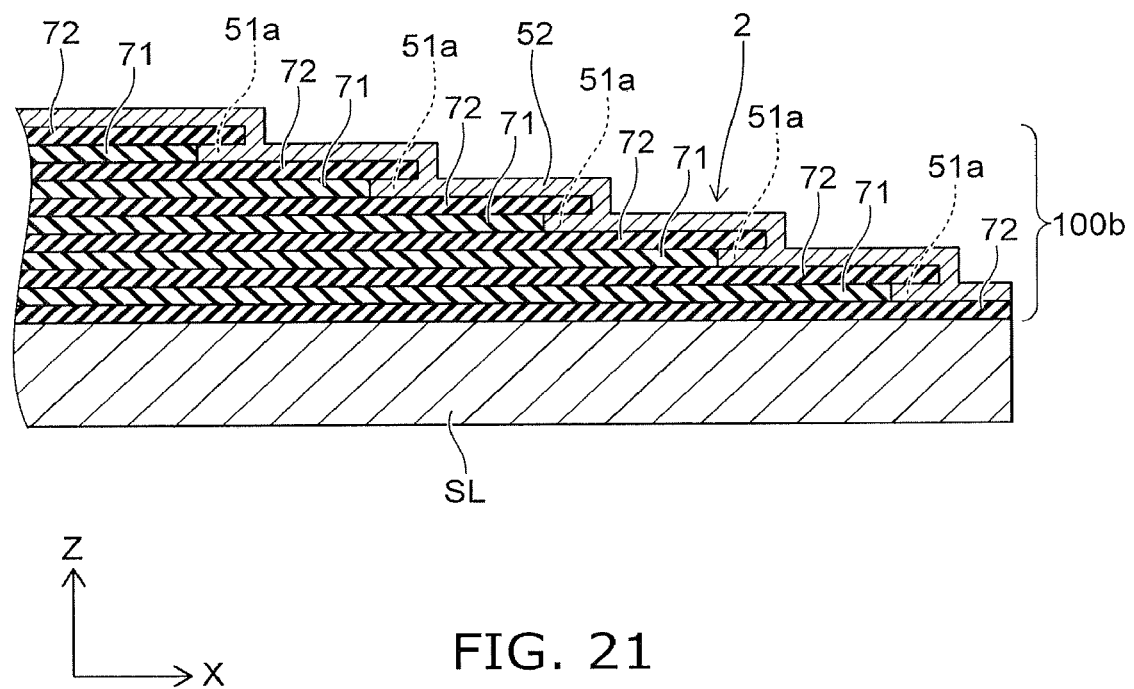
Figure 22:
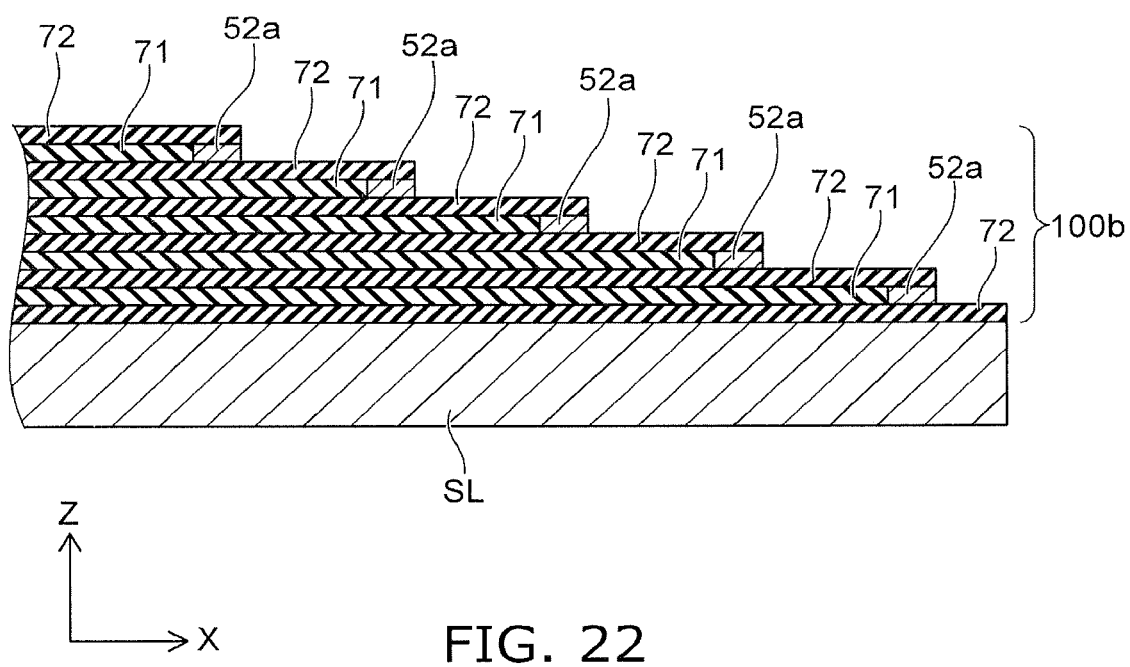

FIG. 18 to FIG. 29 are schematic cross-sectional views showing processes for the portion shown in FIG. 3. FIG. 20 to FIG. 22 are cross-sectional views in which only the first column 91 is extracted.

Figure 30A:
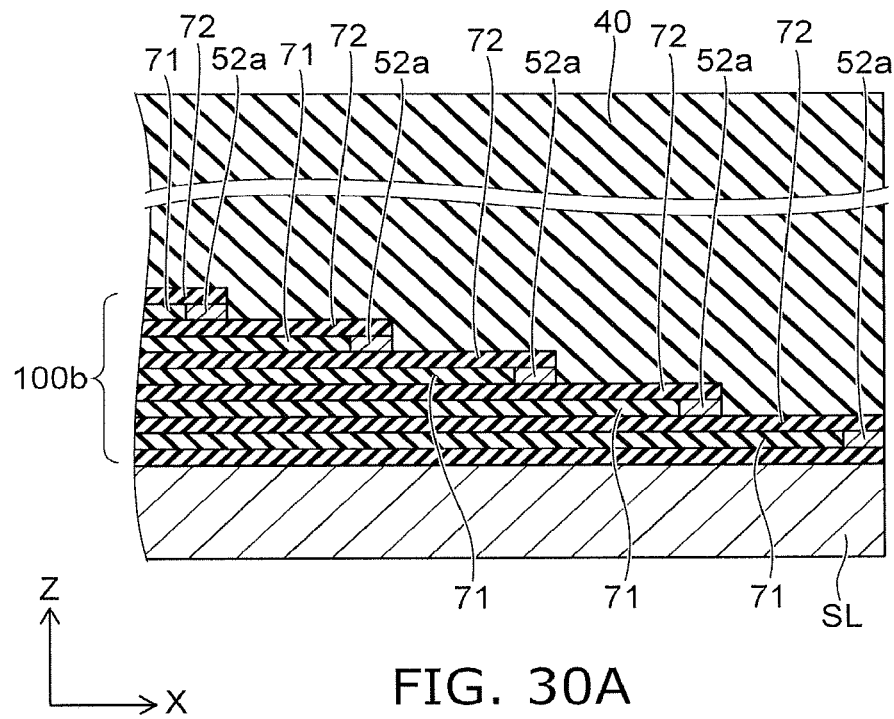
Figure 31A:
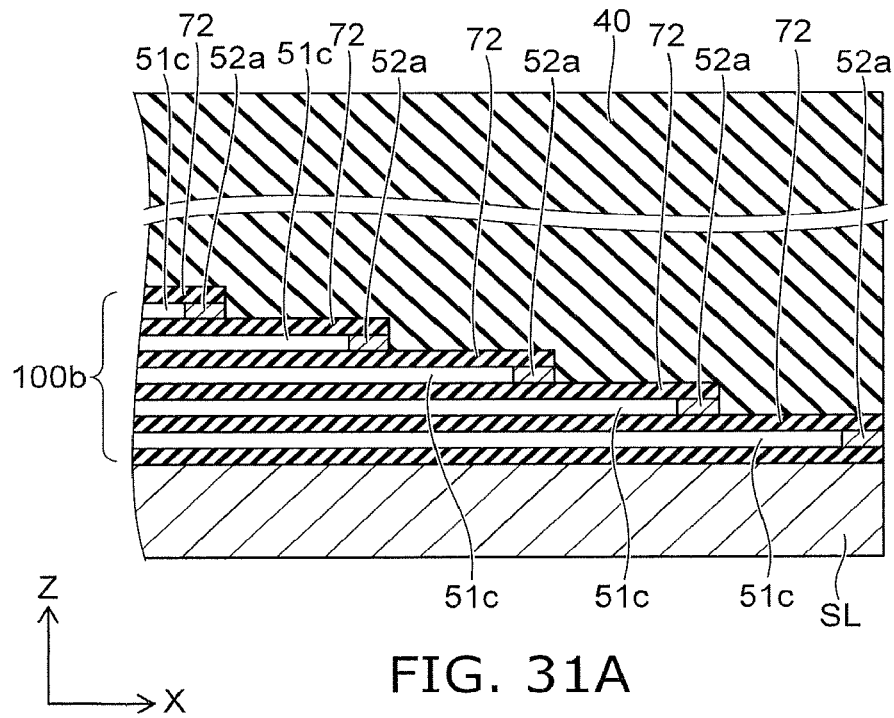
Figure 32A:
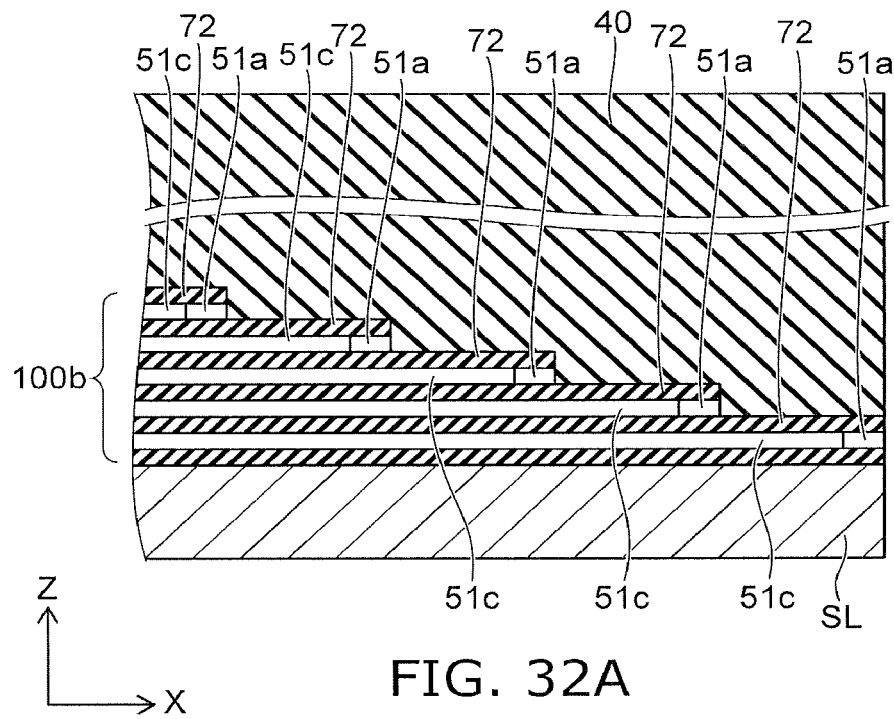

FIG. 30A, FIG. 31A, and FIG. 32A are schematic cross-sectional views showing processes for the portion shown in FIG. 4A.

Figure 30B:
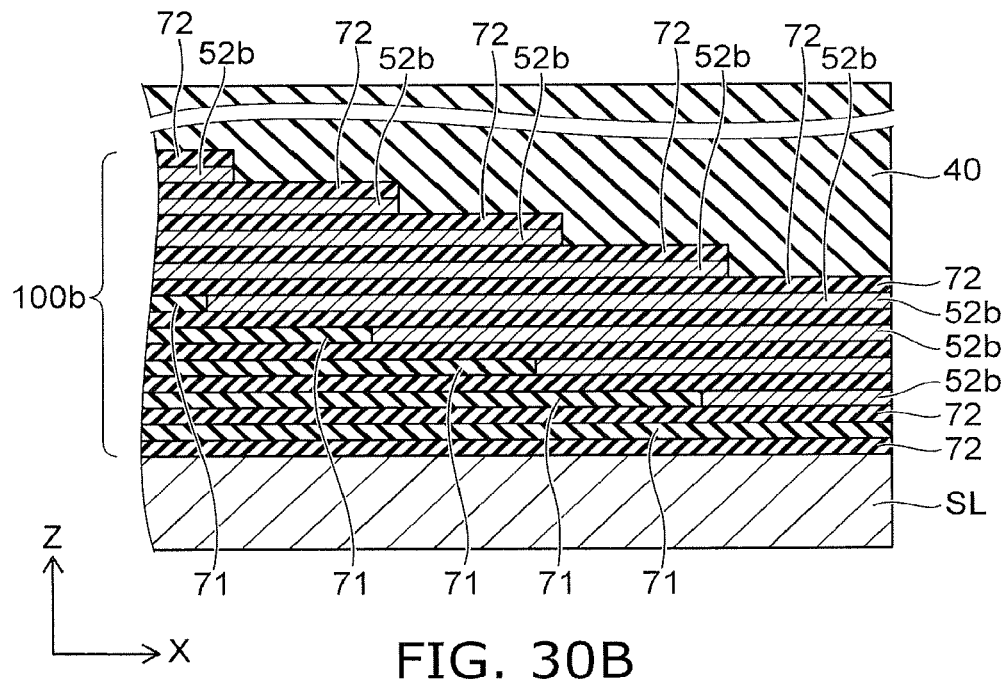
Figure 31B:
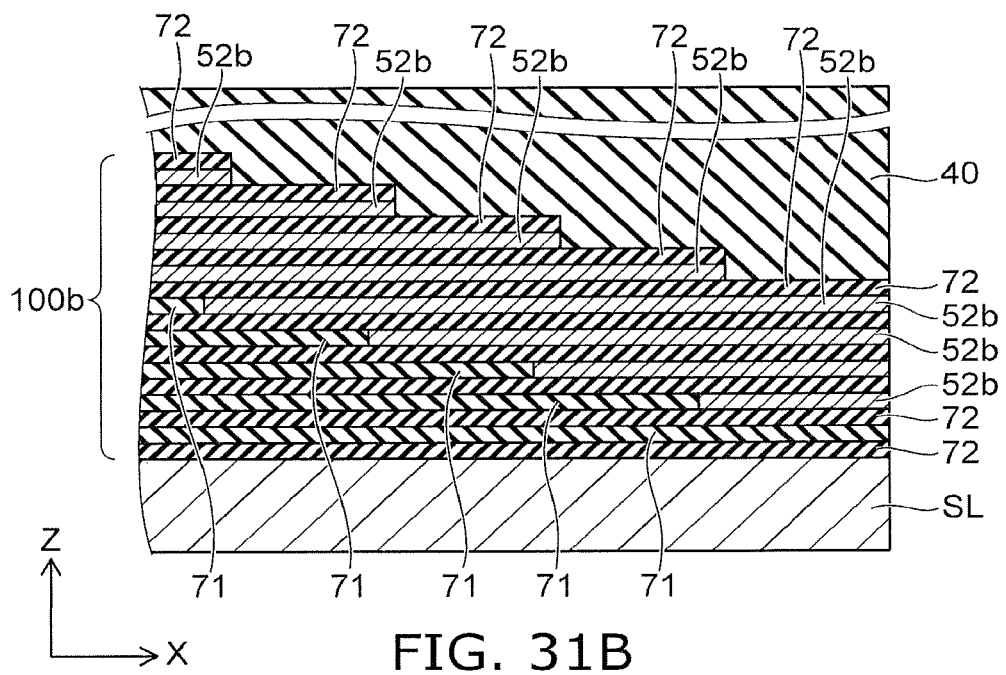
Figure 32B:
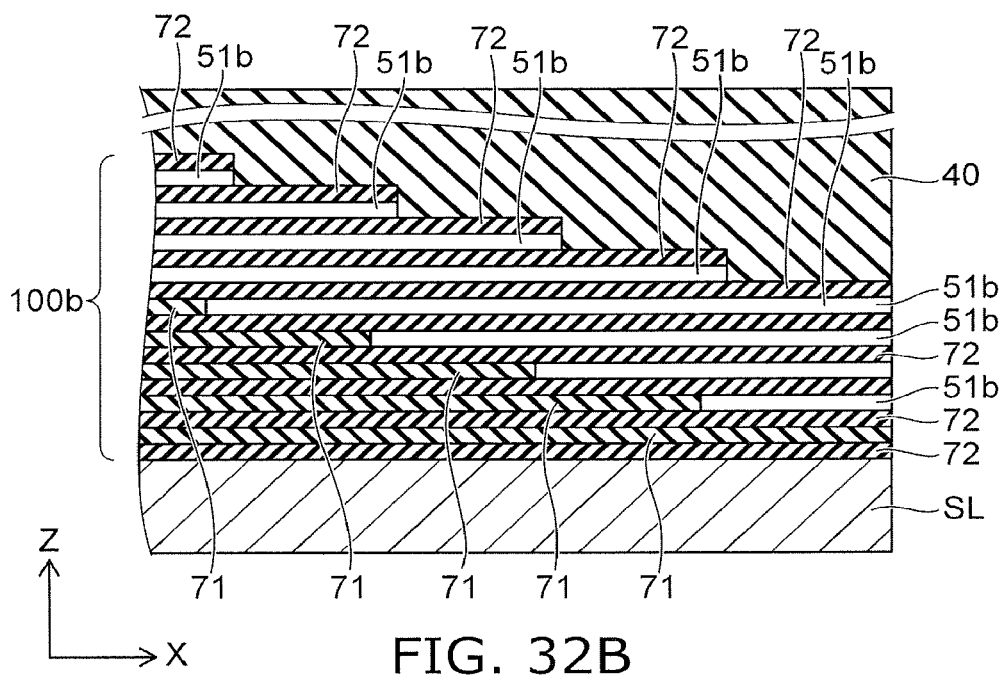

FIG. 30B, FIG. 31B, and FIG. 32B are schematic cross-sectional views showing processes for the portion shown in FIG. 4B.

As shown in FIG. 18, a stacked body 100 is formed on the source layer SL. The insulating layer 72 as a second layer and a sacrificial layer 71 as a first layer are stacked alternately on the source layer SL. The stacked body 100 including the multiple insulating layers 72 and the multiple sacrificial layers 71 is formed on the source layer SL by repeating the process of alternately stacking the insulating layer 72 and the sacrificial layer 71. The insulating layer 72 is, for example, a silicon oxide layer; and the sacrificial layer 71 is, for example, a silicon nitride layer.

Figure 7:
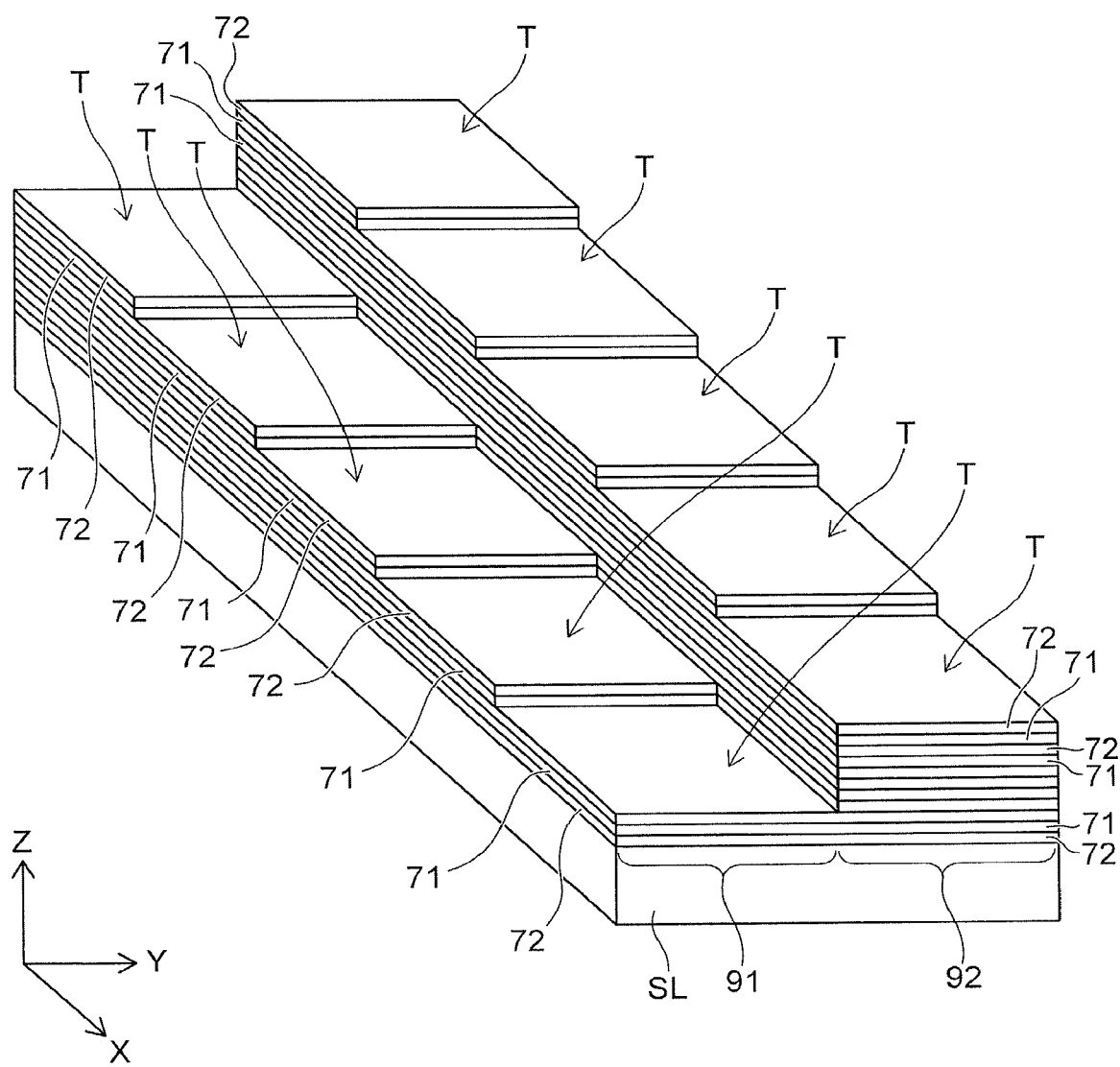
FIG. 7 to FIG. 10 are schematic perspective views showing a method for manufacturing the semiconductor device of the embodiment.

Then, a portion of the stacked body 100 is patterned into a staircase configuration; and the multiple terrace portions T are formed as shown in FIG. 7 and FIG. 19. The multiple terrace portions T are arranged in a staircase configuration with level differences in the two directions of the X-direction and the Y-direction. The insulating layers 72 remain on the upper surfaces of the sacrificial layers 71 of the terrace portions T.

The portion of the stacked body 100 where the terrace portions T are formed is used to form the second stacked portion 100b; and the portion of the stacked body 100 where the terrace portions T are not formed is used to form the first stacked portion 100a.

Figure 8:
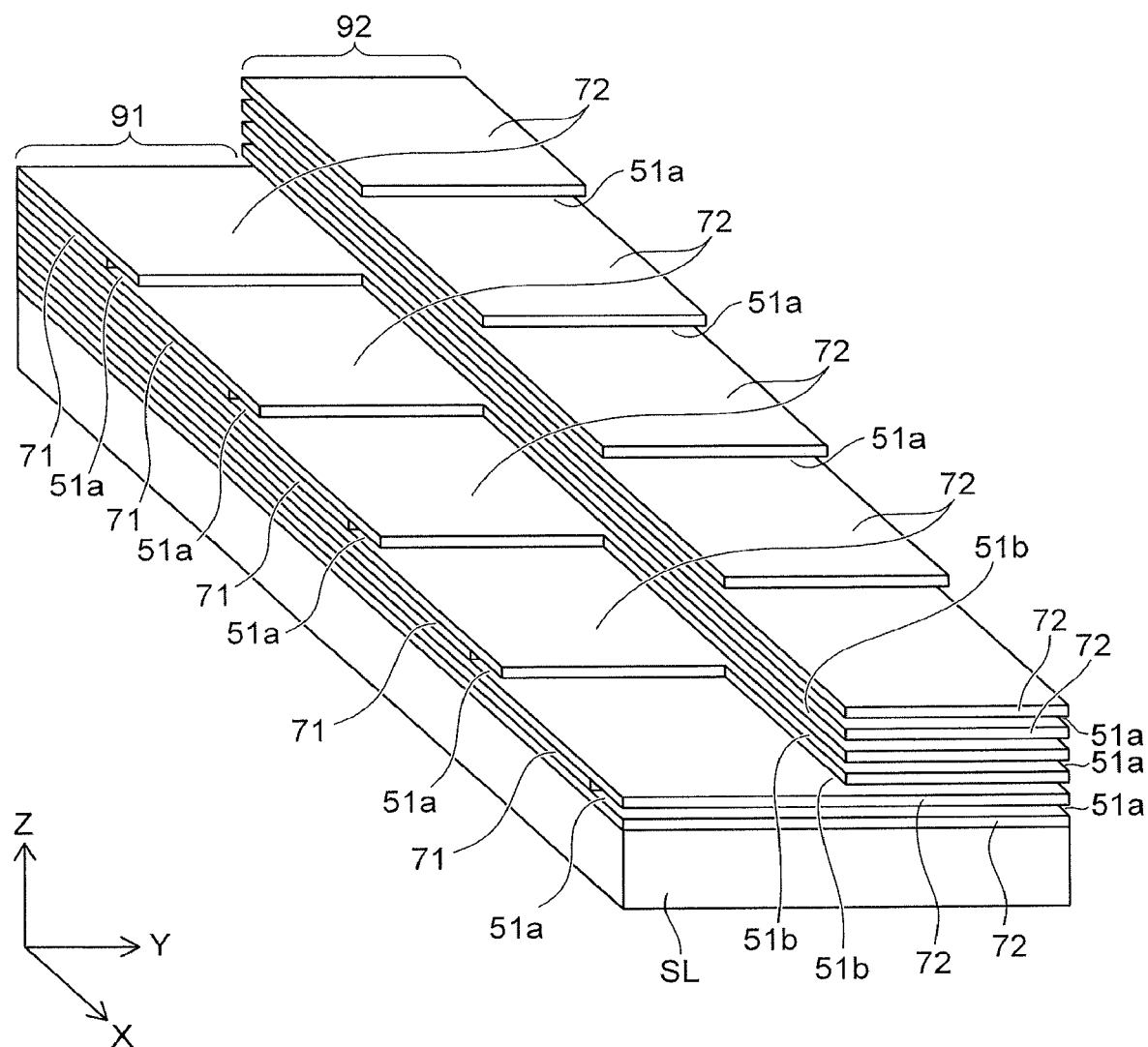
Figure 11A:
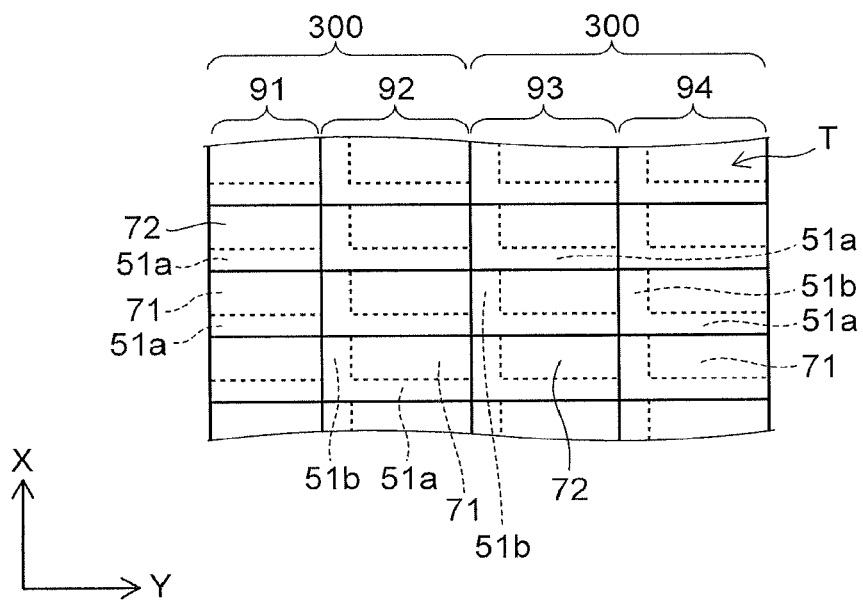
FIG. 11A to FIG. 17B are schematic plan views showing a method for manufacturing the semiconductor device of the embodiment.

Then, as shown in FIG. 8, FIG. 20, and FIG. 11A, the portion of the sacrificial layer 71 provided at the end portion where the terrace portions T form the level difference is caused to recede. At this time, a space 51a is formed between the insulating layers 72 sandwiching the sacrificial layer 71 from above and below by the recession in the X-direction of the X-direction end portion of the sacrificial layer 71. For example, the sacrificial layer 71 which is a silicon nitride layer is etched using an etchant including hot phosphoric acid.

As shown in FIG. 8, the second stacked portion 100b including the second column 92 includes the sacrificial layers 71 provided higher than the upper surface of the first column 91. In addition to the etching from the X-direction end portion, etching progresses also from the first column 91 side for the sacrificial layers 71 higher than the first column 91 in the second stacked portion 100b including the second column 92. Accordingly, a space 51b is formed in the second stacked portion 100b including the second column 92 at the vicinity of the boundary with the first column 91.

As shown in FIG. 11A, the space 51b and the space 51a are connected in an L-shaped configuration. In addition to the etching from the X-direction end portion, etching progresses also from the first column 93 side for the sacrificial layers 71 higher than the first column 93 in the second stacked portion 100b including the second column 94 of the adjacent block 300; and the space 51b is formed in the second stacked portion 100b including the second column 94 at the vicinity of the boundary with the first column 93.

Further, in addition to the etching from the X-direction end portion, etching progresses also from the second column 92 side for the sacrificial layers 71 higher than the second column 92 of the adjacent block 300 (on the left side) in the second stacked portion 100b including the first column 93; and the space 51b is formed in the second stacked portion 100b including the first column 93 at the vicinity of the boundary with the second column 92.

Figure 9:
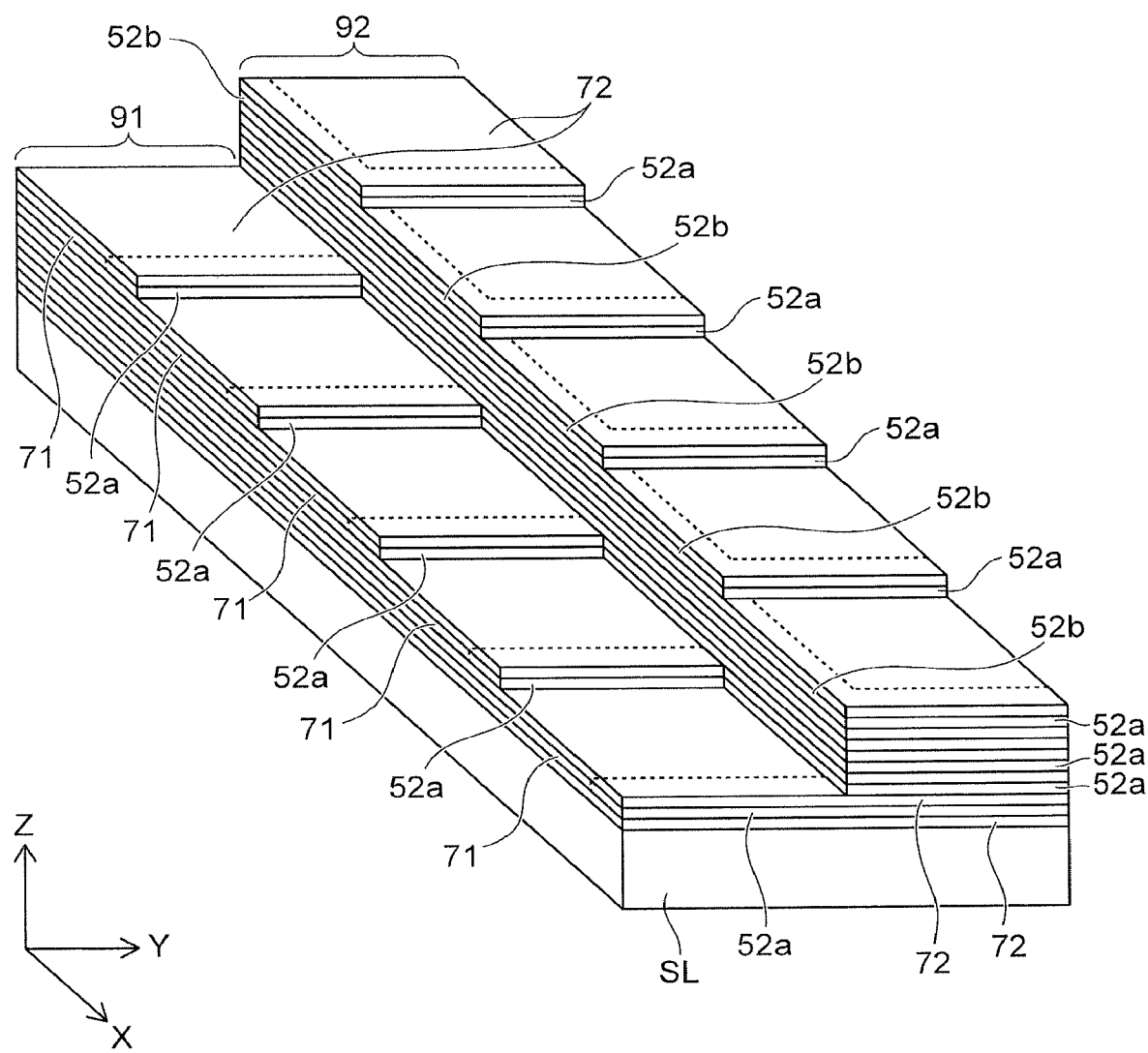
Figure 11B:
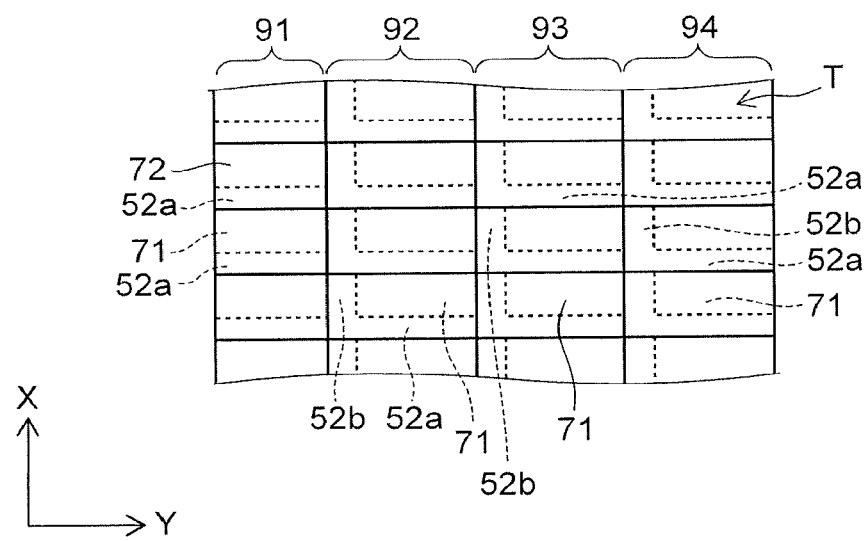

Sacrificial films are formed inside the space 51a and the space 51b. As shown in FIG. 9, FIG. 11B, and FIG. 22, a sacrificial film 52a is formed inside the space 51a; and a sacrificial film 52b is formed inside the space 51b. The sacrificial film 52a and the sacrificial film 52b are formed as one body inside the space 51a and inside the space 51b and are, for example, a polycrystalline silicon film.

As shown in FIG. 21, the sacrificial film 52 is formed along the staircase configuration of the staircase portion 2; and the sacrificial film 52 also enters the space 51a and the space 51b. Subsequently, for example, the sacrificial film 52 formed on the upper surface of the staircase portion 2 is removed by RIE (Reactive Ion Etching).

The sacrificial layers 71 remain in the other regions of the layers of the second stacked portion 100b where the sacrificial films 52a and 52b are formed.

Figure 10:
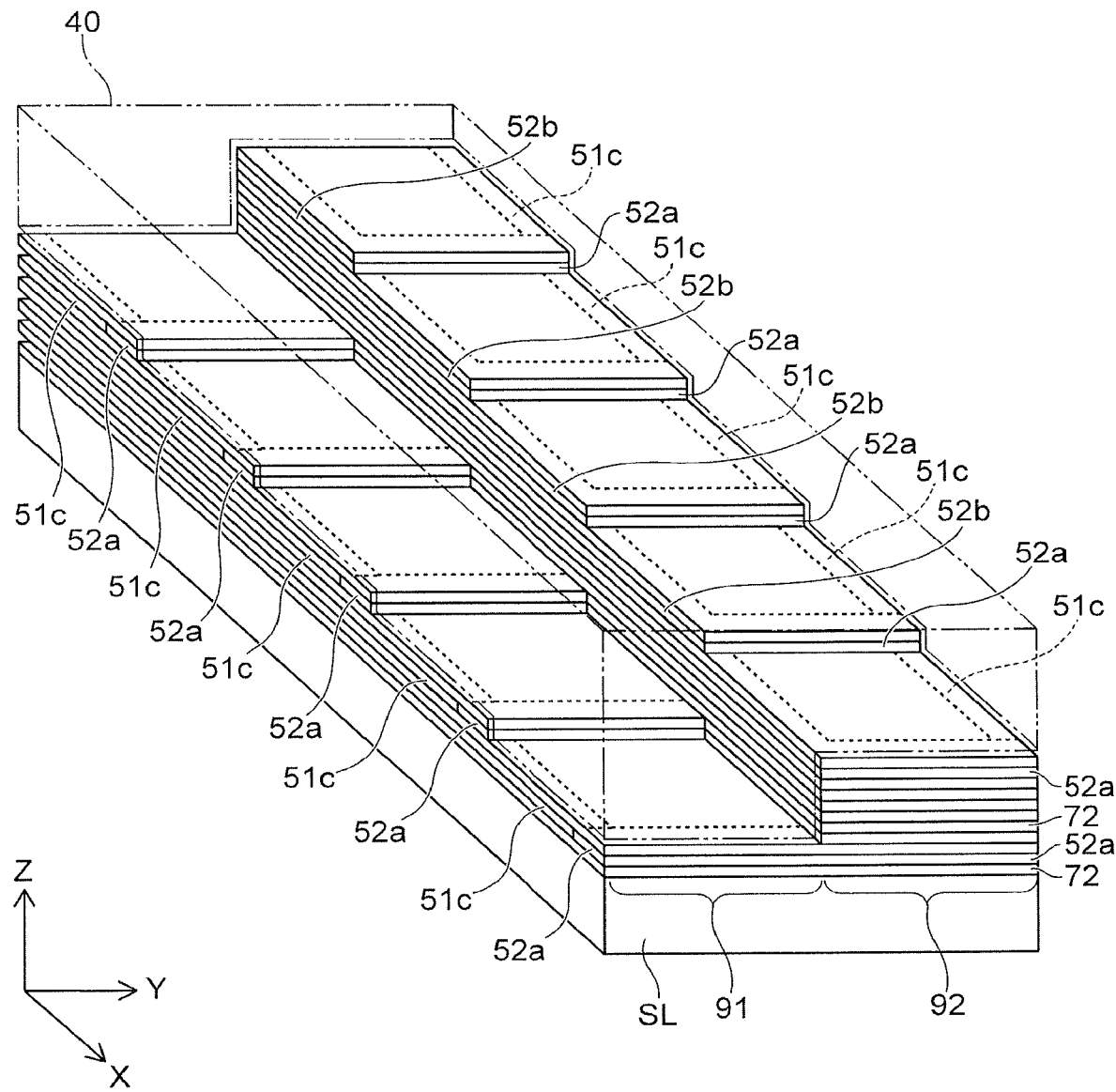
Figure 23:
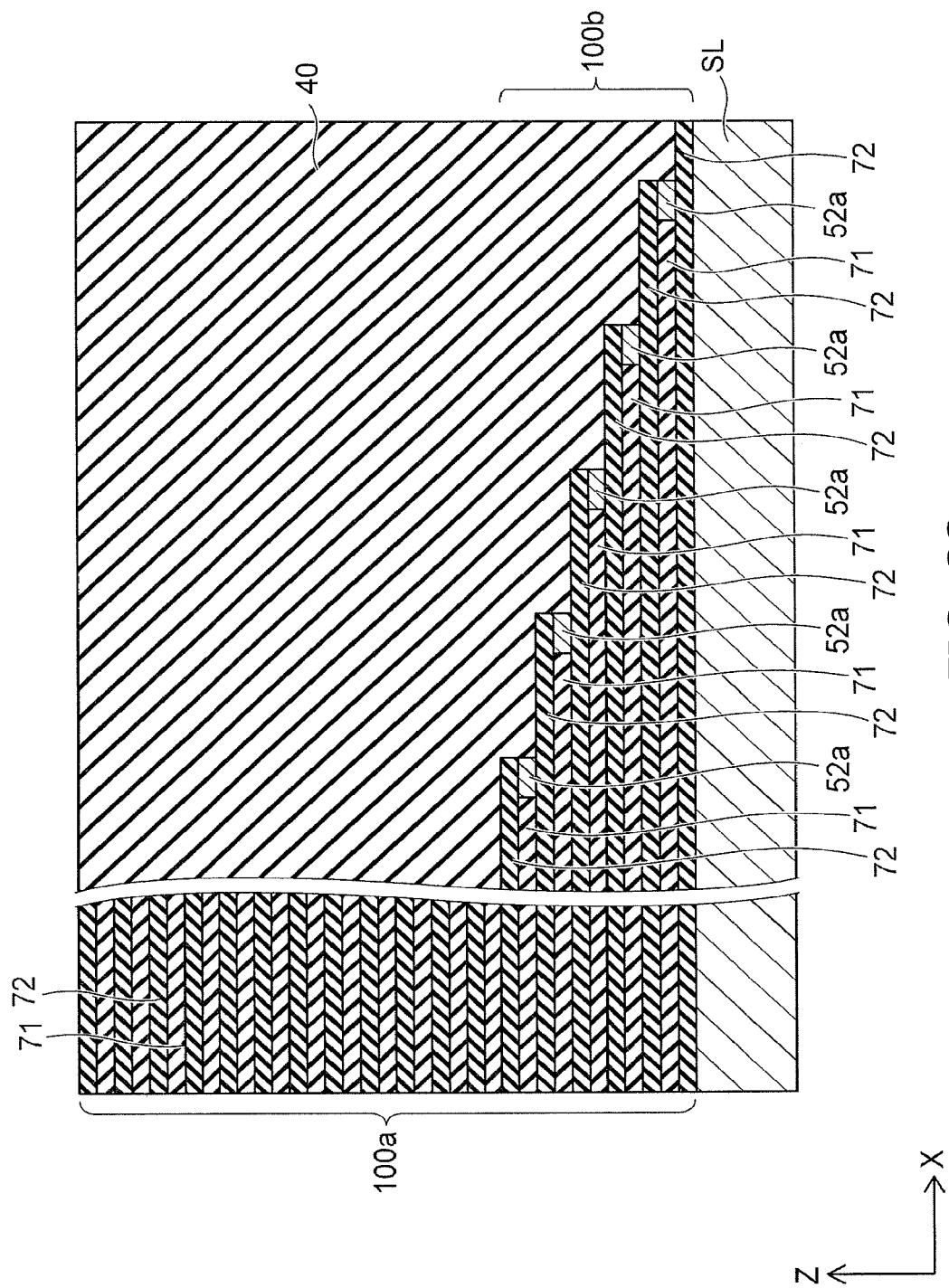

Subsequently, as shown in FIG. 10 and FIG. 23, the inter-layer insulating film 40 is formed on the second stacked portion 100b to cover the multiple terrace portions T. The level differences in the X-direction of the columns 91 to 94 and the level differences in the Y-direction between the columns 91 to 94 are filled with the inter-layer insulating film 40. The upper surface of the inter-layer insulating film 40 is planarized.

Figure 24:
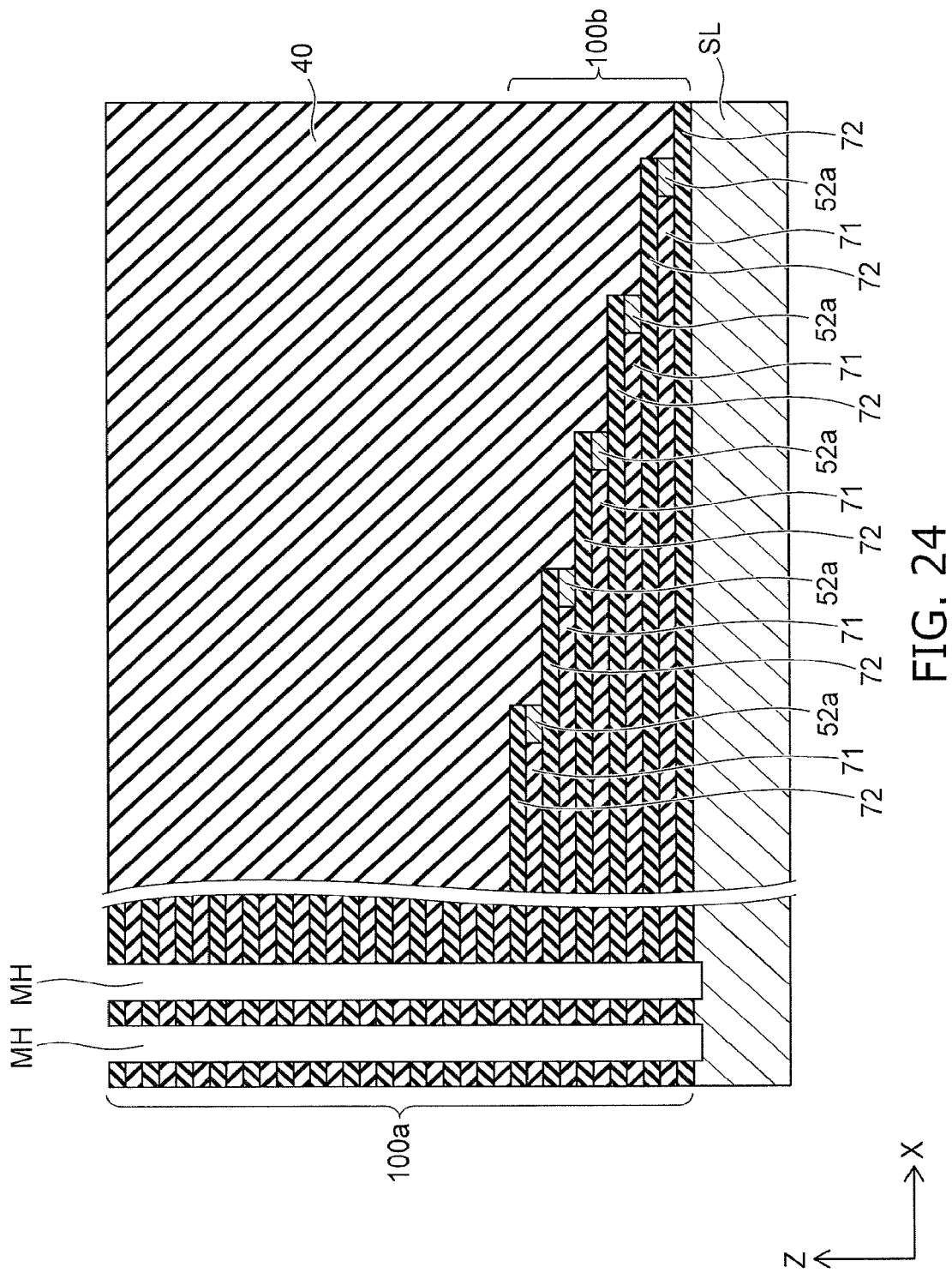

Subsequently, as shown in FIG. 24, multiple memory holes MH are formed in the first stacked portion 100a by, for example, RIE. The memory holes MH pierce the first stacked portion 100a and reach the source layer SL.

Figure 25:
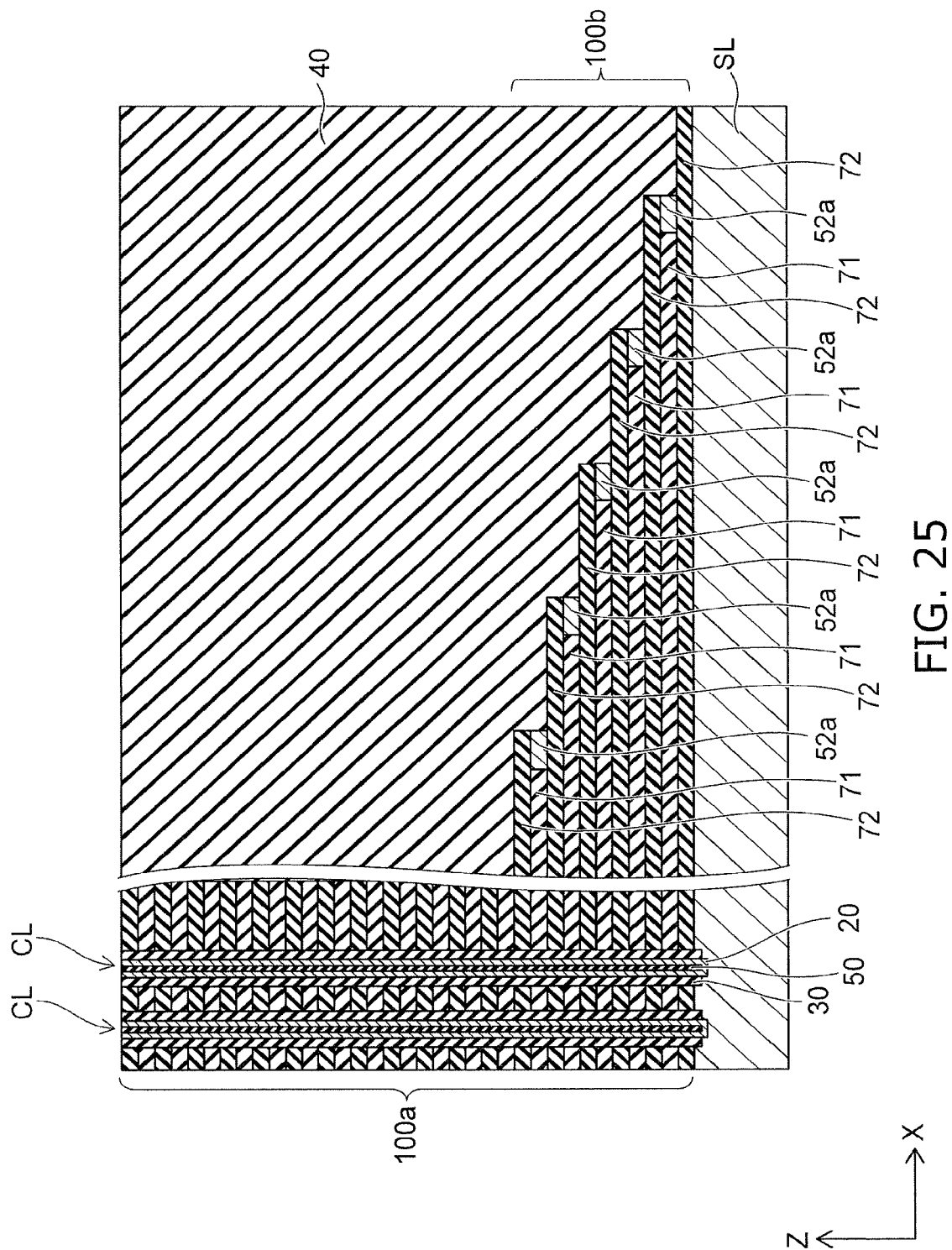

As shown in FIG. 25, the columnar portions CL are formed inside the memory holes MH. The memory film 30, the semiconductor body 20, and the core film 50 are formed in order inside the memory holes MH. The lower end portions of the semiconductor bodies 20 contact the source layer SL.

Figure 12:
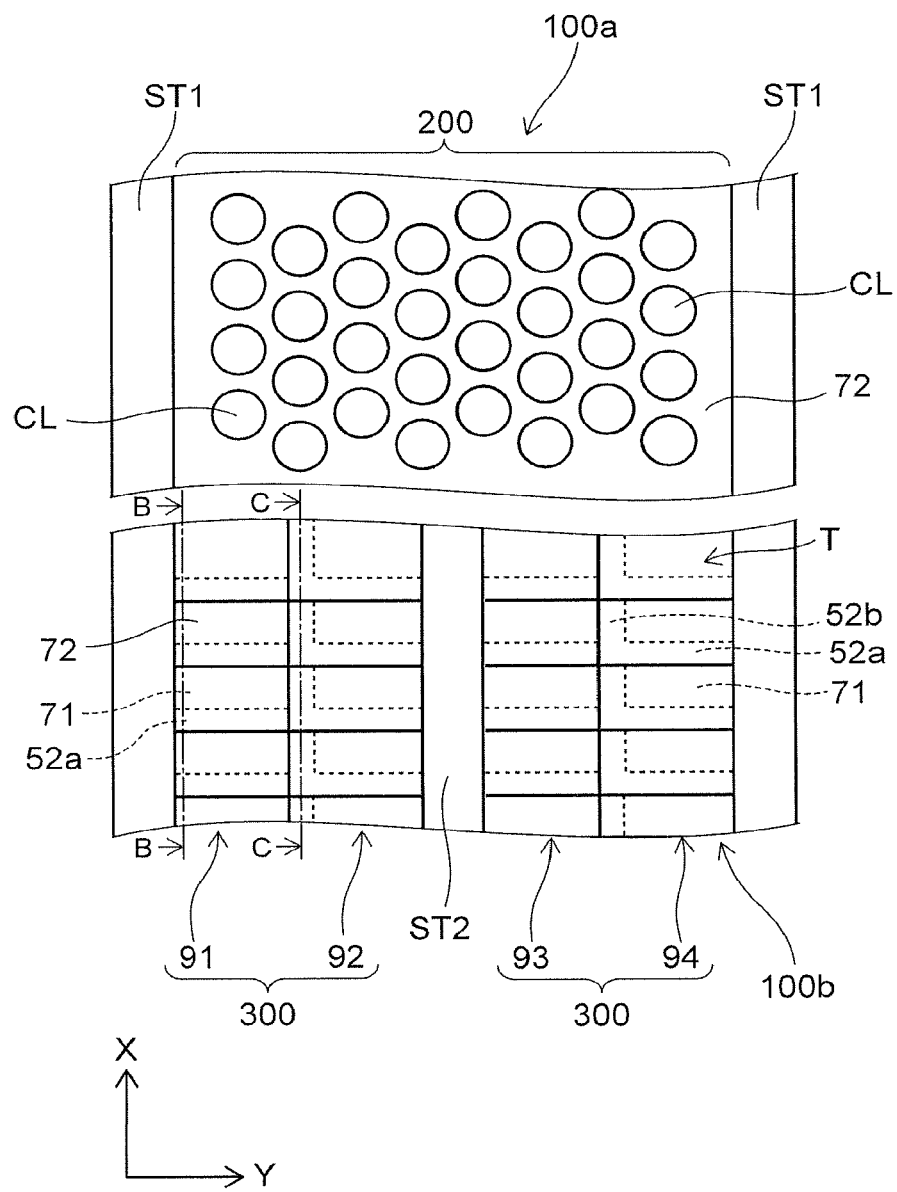

Subsequently, as shown in FIG. 12, multiple slits ST1 are formed in the first stacked portion 100a and the second stacked portion 100b. In addition to the slits ST1, a slit ST2 is further formed in the second stacked portion 100b.

The slits ST1 and ST2 are formed by RIE using a not-illustrated mask, pierce the first stacked portion 100a, the second stacked portion 100b, and the inter-layer insulating film 40 on the second stacked portion 100b, and reach the source layer SL. The slits ST1 extend to be continuous in the X-direction through the first stacked portion 100a and through the second stacked portion 100b. The slit ST2 extends in the X-direction through the second stacked portion 100b and is not formed in the first stacked portion 100a.

The first stacked portion 100a is divided into the multiple blocks 200 in the Y-direction by the slits ST1. The second stacked portion 100b is divided into the multiple blocks 300 in the Y-direction by the slits ST1 and the slit ST2.

The slit ST2 is formed between the second column 92 of the block 300 on the left side of FIG. 12 and the first column 93 of the block 300 on the right side of FIG. 12; and the second column 92 and the first column 93 are adjacent to the slit ST2. The side surface of the first column 91 on the side opposite to the second column 92 is adjacent to the slit ST1. The side surface of the second column 94 on the side opposite to the first column 93 is adjacent to the slit ST1.

FIG. 30A is a B-B cross-sectional view of FIG. 12; and FIG. 30B is a C-C cross-sectional view of FIG. 12.

Figure 13:
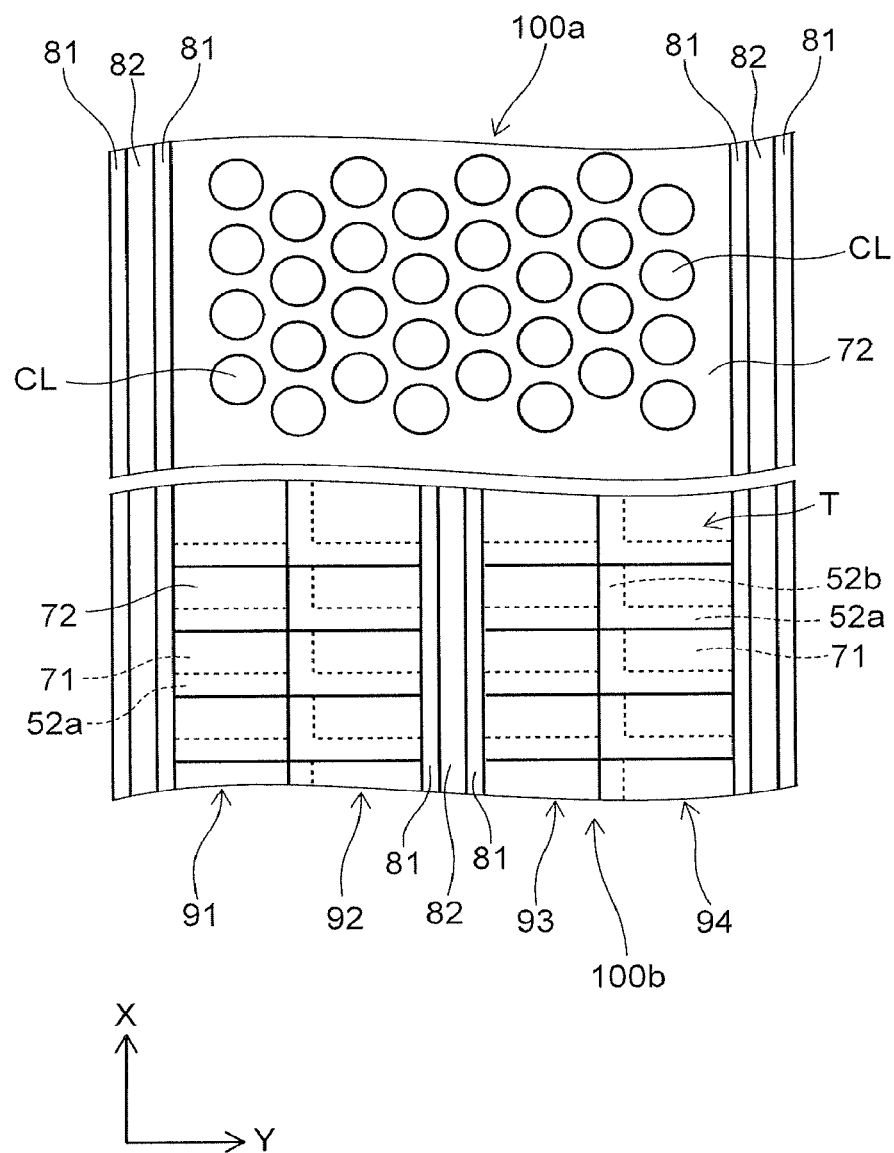

As shown in FIG. 13, a cover film 81 and a resist film 82 are formed inside the slits ST1 and inside the slit ST2. The side surface of the first stacked portion 100a, the side surface of the second stacked portion 100b, and the side surface of the inter-layer insulating film 40 exposed in the slits ST1 are covered with the cover film 81; and the side surface of the second stacked portion 100b and the side surface of the inter-layer insulating film 40 exposed in the slit ST2 are covered with the cover film 81. The resist film 82 is formed on the inner side of the cover film 81.

The cover film 81 is a film of a material different from the sacrificial layer 71 which is a silicon nitride layer, and is, for example, a polycrystalline silicon film.

Figure 14:
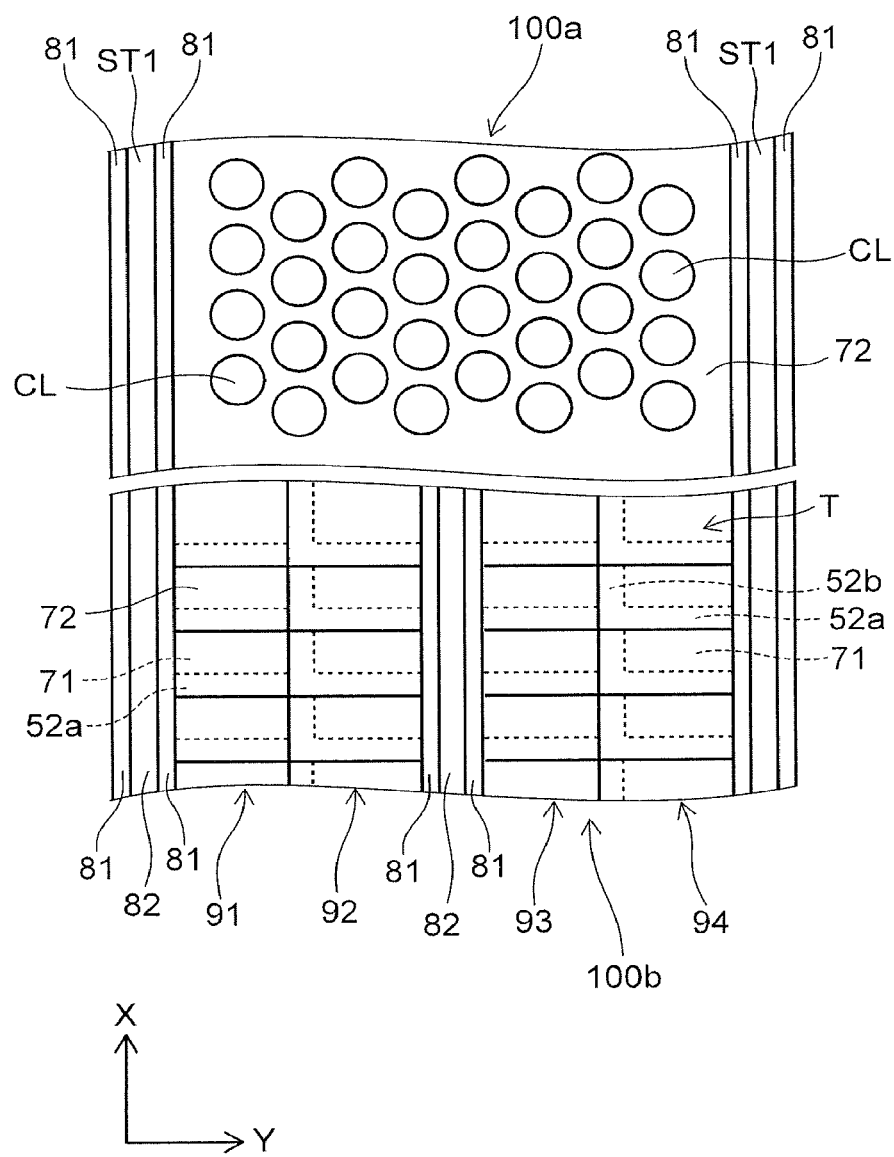

The resist film 82 inside the slits ST1 formed in the first stacked portion 100a is removed by exposing and developing the resist film 82. As shown in FIG. 14, a portion of the slits ST1 formed in the first stacked portion 100a appears. The side surface of the cover film 81 is exposed in the portion of the slits ST1.

Then, the cover film 81 formed in the slits ST1 of the first stacked portion 100a is removed in the state in which the region including the second stacked portion 100b and the cover film 81 is covered with a not-illustrated mask layer. An etchant is supplied to the interior of the slits ST1 on the inner side of the cover film 81; and the cover film 81 formed in the slits ST1 of the first stacked portion 100a is removed. Subsequently, the mask layer covering the second stacked portion 100b is removed; and the resist film 82 formed in the slits ST1 and ST2 of the second stacked portion 100b is removed.

Figure 15:
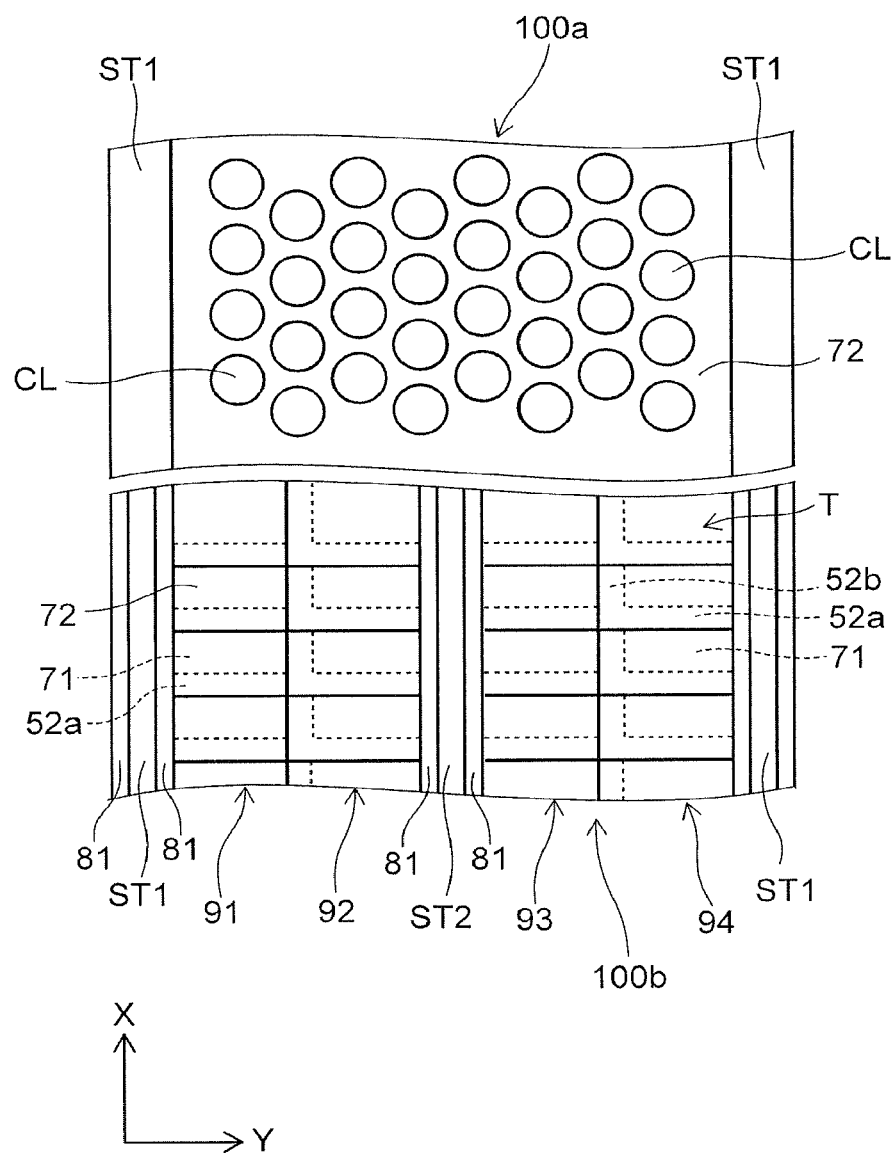

As shown in FIG. 15, the slits ST1 formed in the first stacked portion 100a appear; and the side surface of the first stacked portion 100a is exposed in the slits ST1. Inside the slits ST1 and the slit ST2 formed in the second stacked portion 100b, the cover film 81 remains; and the side surface of the second stacked portion 100b is covered with the cover film 81.

Then, the sacrificial layers 71 of the first stacked portion 100a are removed by an etchant or an etching gas supplied through the exposed slits ST1. For example, the sacrificial layers 71 which are silicon nitride layers are removed using an etchant including hot phosphoric acid.

Figure 26:
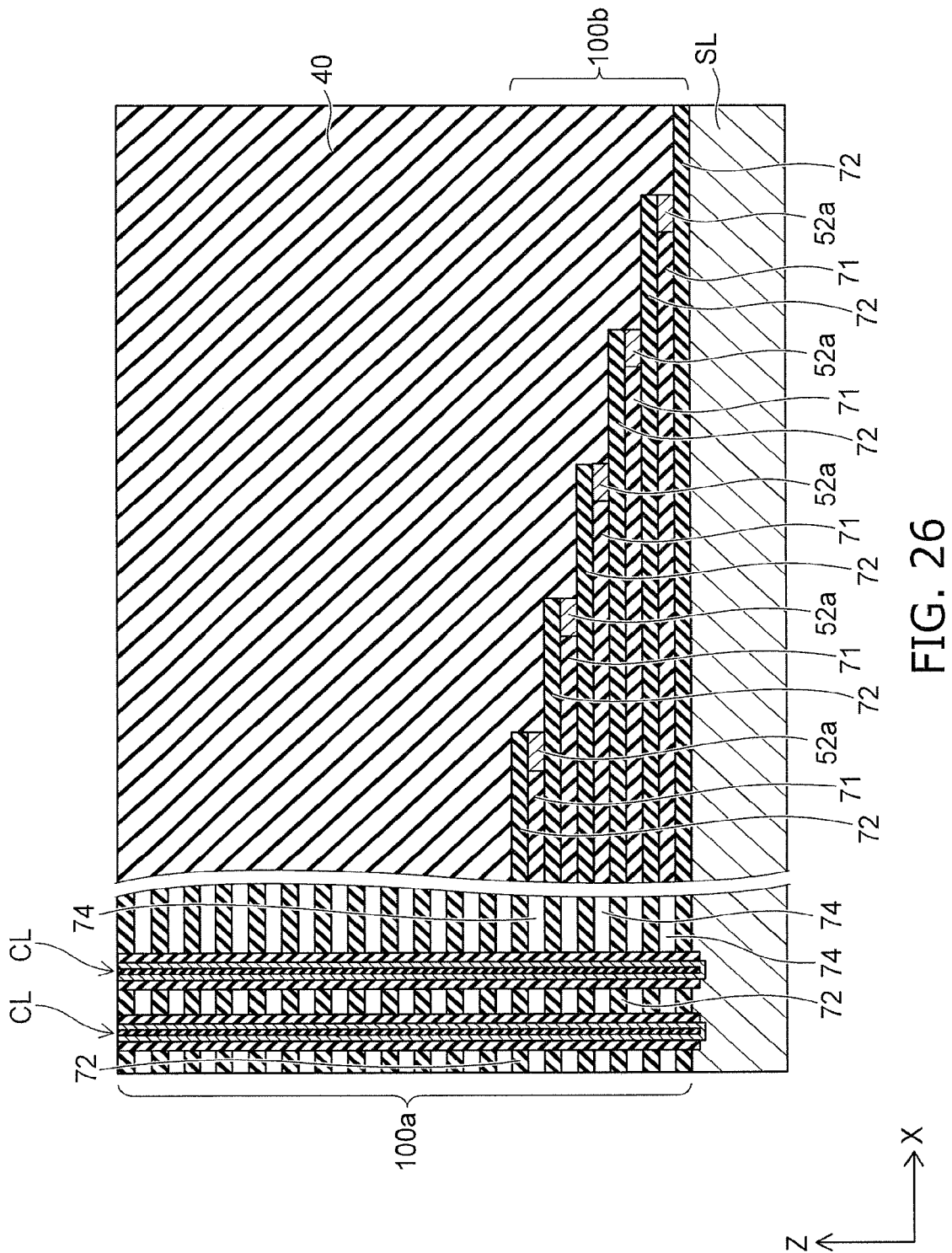

The sacrificial layers 71 of the first stacked portion 100a are removed; and as shown in FIG. 26, a space (an air gap) 74 is formed between the insulating layers 72 adjacent to each other above and below. At this time, the multiple insulating layers 72 stacked with the space 74 interposed contact the side surfaces of the columnar portions CL to surround the side surfaces of the multiple columnar portions CL. The multiple insulating layers 72 are supported by such a physical bond with the multiple columnar portions CL; and the space 74 is maintained between the insulating layers 72.

The side surfaces of the sacrificial layers 71 of the second stacked portion 100b on the slit ST1 and ST2 sides are covered with the cover film 81, are not exposed in the slits ST1 and ST2, and therefore are not etched. The etching of the sacrificial layers 71 of the first stacked portion 100a progresses from the side surfaces exposed in the slits ST1. Although the etching of the sacrificial layers 71 progresses also in the X-direction, the etching time is controlled so that the sacrificial layers 71 of the second stacked portion 100b remain.

Figure 16A:
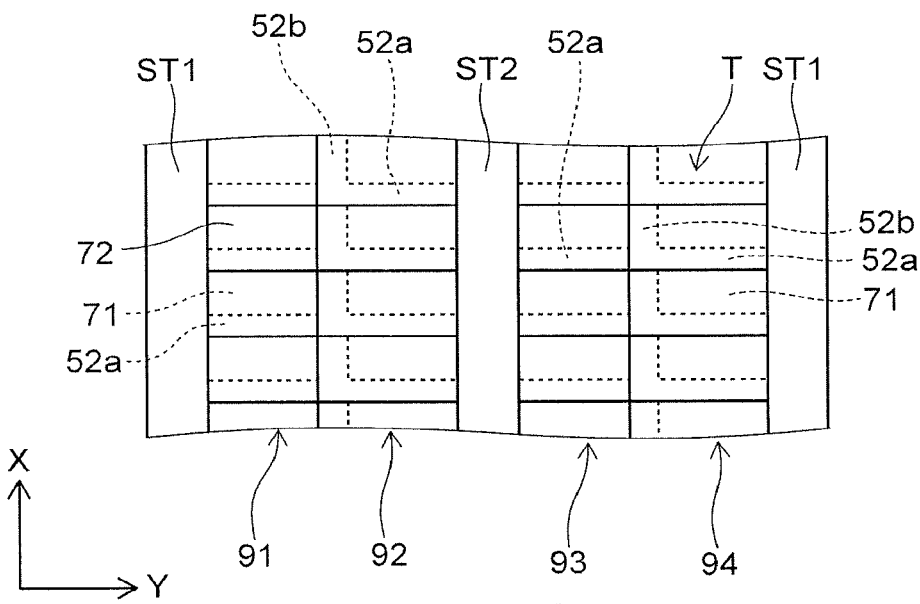

Then, the cover film 81 inside the slits ST1 and inside the slit ST2 formed in the second stacked portion 100b is removed. As shown in FIG. 16A, the slits ST1 and the slit ST2 formed in the second stacked portion 100b appear.

The sacrificial layers 71 and the sacrificial films 52a of the first column 91 of the second stacked portion 100b are exposed in the slits ST1. The sacrificial layers 71 and the sacrificial films 52a of the second column 92 of the second stacked portion 100b are exposed in the slit ST2. The sacrificial layers 71 and the sacrificial films 52a of the first column 93 of the second stacked portion 100b are exposed in the slit ST2. The sacrificial layers 71 and the sacrificial films 52a of the second column 94 of the second stacked portion 100b are exposed in the slits ST1.

Then, the portions of the sacrificial layers 71 of the second stacked portion 100b exposed in the slits ST1 and the slit ST2 are caused to recede by etching using an etching gas or an etchant supplied to the slits ST1 and the slit ST2. For example, the sacrificial layers 71 which are silicon nitride layers are etched using an etchant including hot phosphoric acid.

Figure 16B:
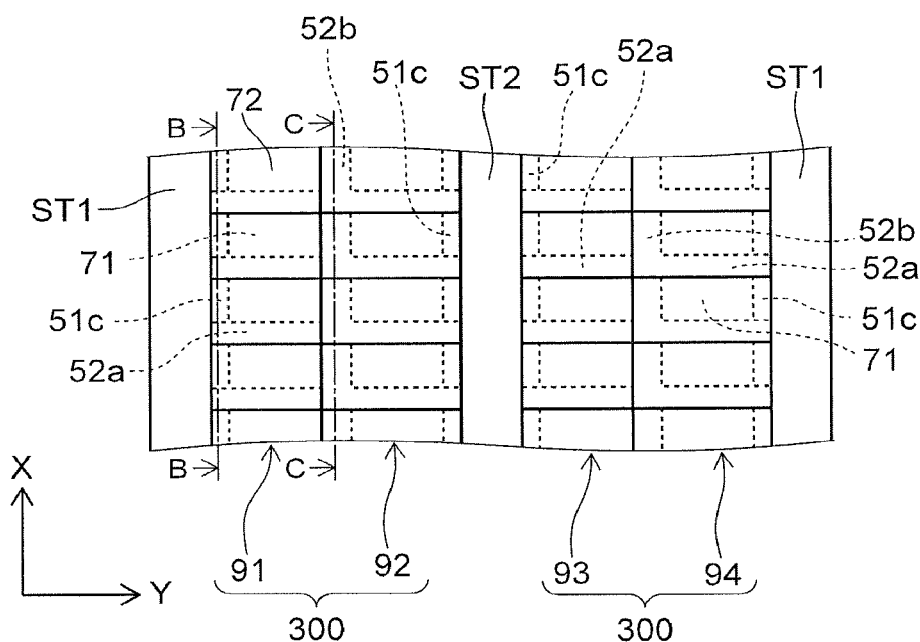

By etching a portion of the sacrificial layers 71, a space 51c is formed in the portions adjacent to the slits ST1 and ST2 of the layers in which the sacrificial layers 71 are formed in each block 300 as shown in FIG. 10, FIG. 16B, and FIG. 31A. FIG. 31A is a B-B cross-sectional view of FIG. 16B.

At this time, the etchant enters the space 74 formed in the first stacked portion 100a also from the slits ST1 of the first stacked portion 100a; and the sacrificial layers 71 that remain in the second stacked portion 100b are etched in the X-direction. By controlling the etching time, the etching of the sacrificial layers 71 of the second stacked portion 100b stops at one portion on the slit ST1 and ST2 sides so that a portion of the sacrificial layers 71 remains in the second stacked portion 100b while suppressing the etching amount from the first stacked portion 100a side (the space 74 side) of the sacrificial layers 71. The space 51c extends in the X-direction along the Y-direction edges of the columns 91 to 94 and communicates with the space 74 formed in the first stacked portion 100a.

As shown in FIG. 10, FIG. 16B, FIG. 31A, and FIG. 31B, the sacrificial films 52a and 52b which are, for example, polycrystalline silicon films remain after the etching of the sacrificial layers 71 (after the formation of the space 51c). FIG. 31B is a C-C cross-sectional view of FIG. 16B.

One end portion in the Y-direction of the sacrificial film 52a is exposed in the slit ST1 or the slit ST2. Then, the sacrificial film 52a is removed by the etchant supplied to the slits ST1 and ST2.

Figure 17A:
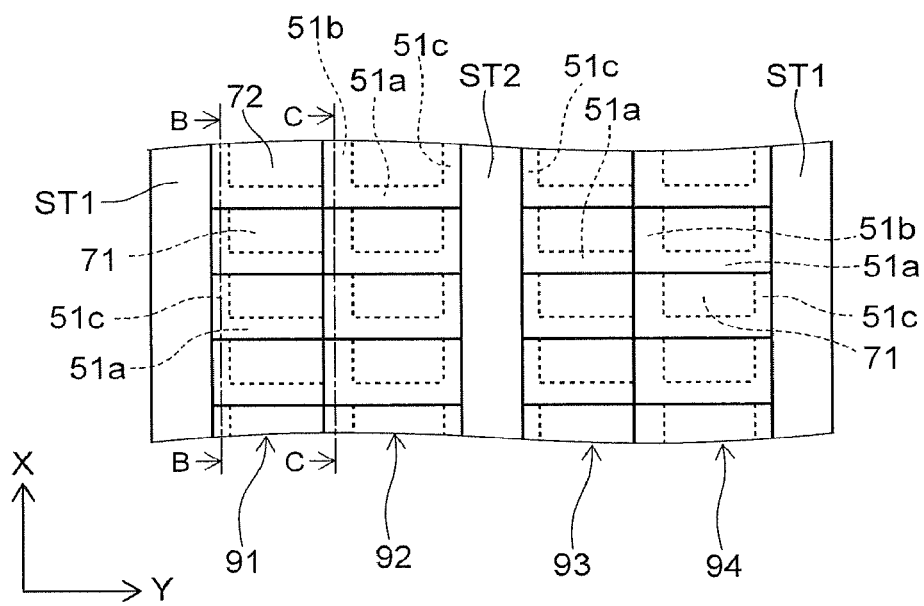
Figure 17B:
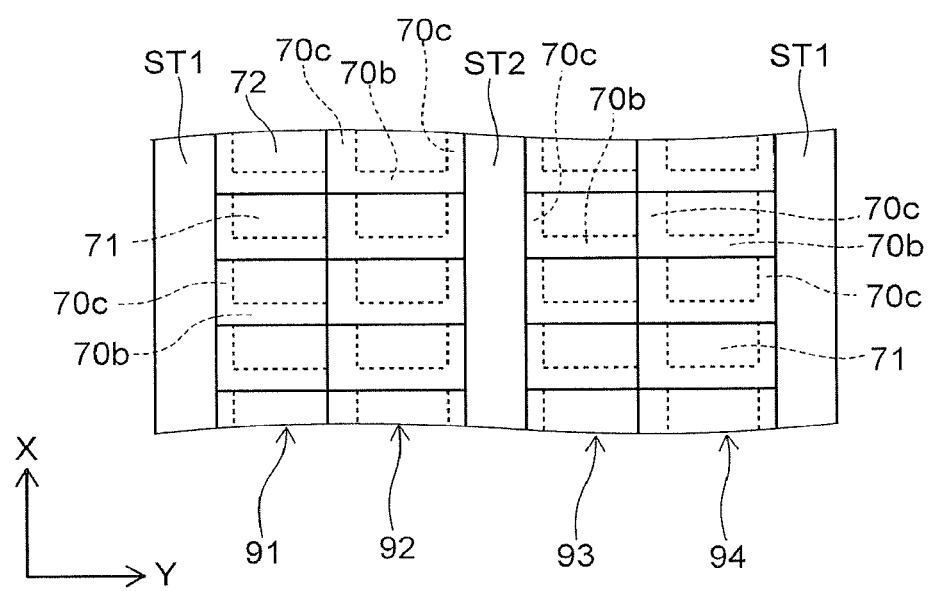
Figure 27:
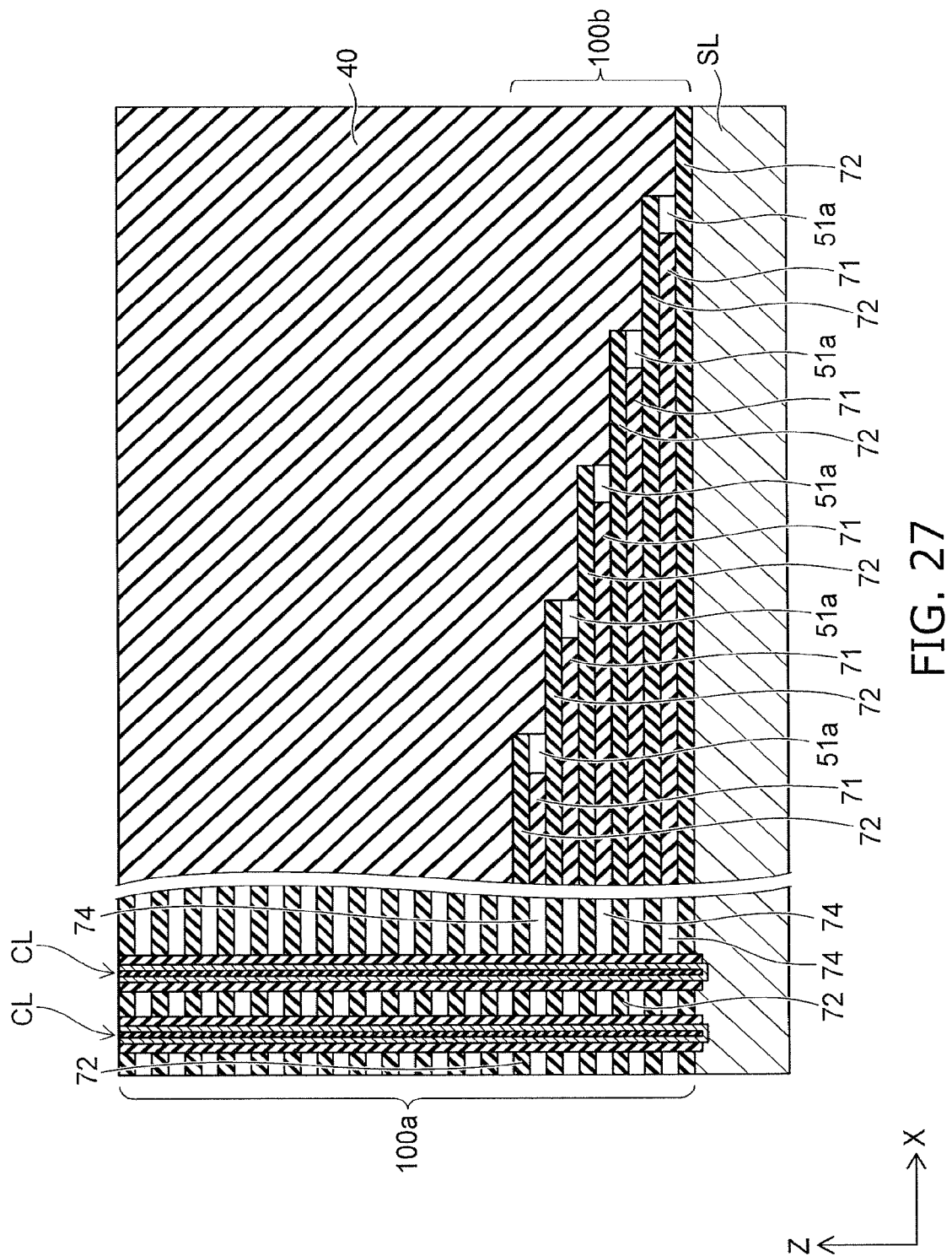
Figure 28:
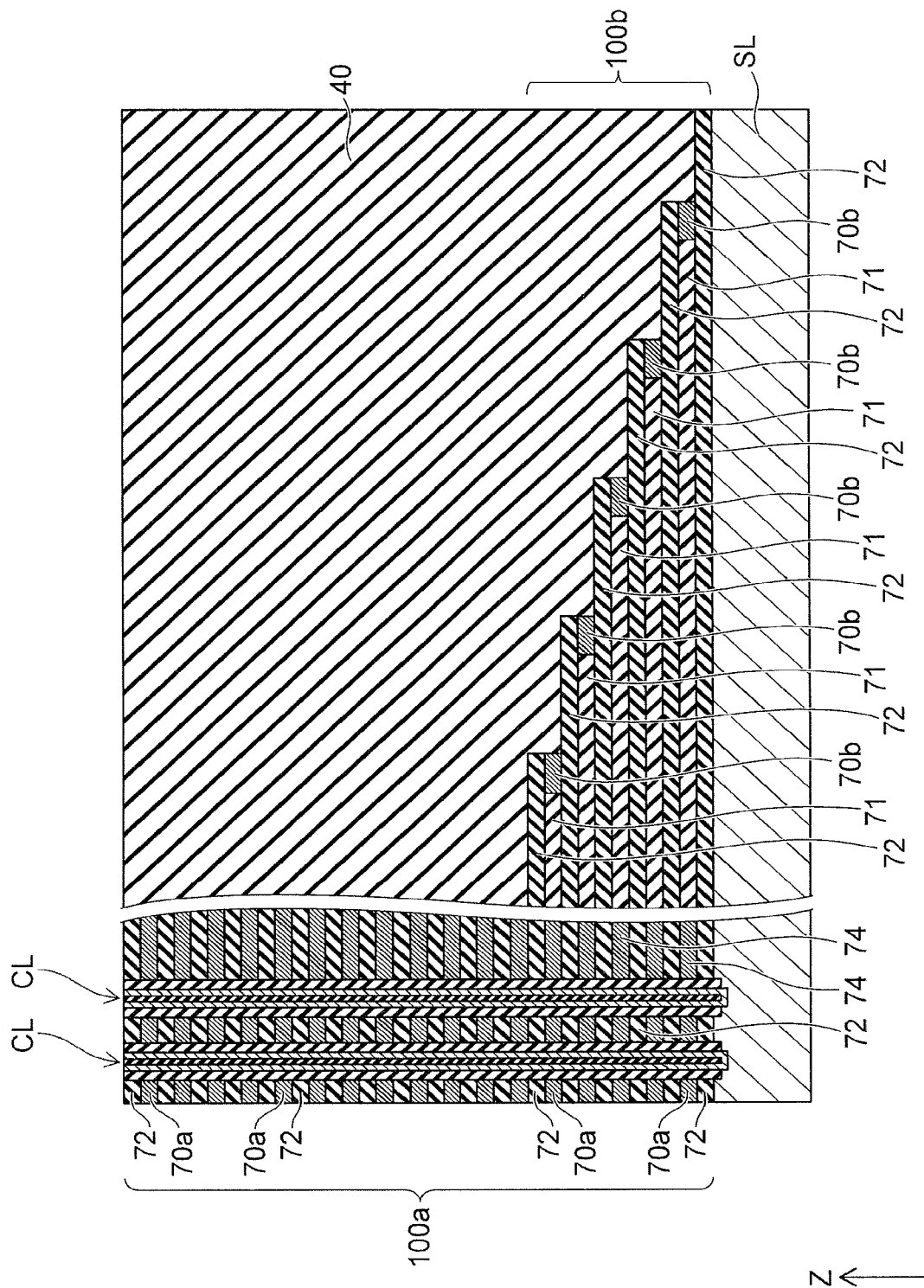

The sacrificial films 52a are removed; and the space 51a appears as shown in FIG. 17A, FIG. 27, and FIG. 32A. FIG. 32A is a B-B cross-sectional view of FIG. 17A.

The sacrificial films 52b formed in the second stacked portion 100b including the second columns 92 and 94 are exposed in the space 51a; the sacrificial films 52b also are removed by the etchant entering the space 51a; and the space 51b appears as shown in FIG. 17A and FIG. 32B. FIG. 32B is a C-C cross-sectional view of FIG. 17A.

The state of the second stacked portion 100b is a state in which the spaces 51a, 51b, and 51c communicating with the space 74 are formed in the same layers as the layers in which the space 74 of the first stacked portion 100a is formed.

As described above, the multiple insulating layers 72 stacked with the space 74 interposed in the first stacked portion 100a are supported by the multiple columnar portions CL.

On the other hand, in the second stacked portion 100b, one portion of the sacrificial layers 71 remains; the remaining one portion supports the insulating layers 72 directly above as shown in FIG. 27 as the spacer portions 71; and the spaces 51a, 51b, and 51c are maintained.

The ratio of the planar surface area of the spaces 51a, 51b, and 51c, and the planar surface area of the spacer portions 71 of the second stacked portion 100b are set so that the insulating layers 72 do not flex.

The sacrificial layers 71 remain in the second stacked portion 100b so that the insulating layers 72 do not flex in the state in which the spaces 74, 51a, 51b, and 51c are formed prior to replacing the sacrificial layers 71 with the conductive material. The columnar portions are not disposed in the second stacked portion 100b. Accordingly, it is unnecessary to ensure a region for disposing the columnar portions in the terrace portions T; and by this amount, it is possible to reduce the surface area of the terrace portions T. This makes it possible to reduce the surface area of the entire semiconductor device (chip).

Then, a conductive material that is continuous inside the spaces 74, 51a, 51b, and 51c is formed inside the spaces 74, 51a, 51b, and 51c. As shown in FIG. 17B, FIG. 4A, FIG. 4B, FIG. 5, and FIG. 28, the conductive layer 70a is formed in the first stacked portion 100a; and the first conductive portion 70b and the second conductive portion 70c are formed in the second stacked portion 100b.

For example, a tungsten layer is formed as the conductive layer 70a, the first conductive portion 70b, and the second conductive portion 70c by CVD (Chemical Vapor Deposition). At this time, a source gas is supplied to the spaces 74, 51a, 51b, and 51c through the slits ST1 and ST2.

After forming the conductive layer 70a, the first conductive portion 70b, and the second conductive portion 70c, the separation portion 60 is formed as shown in FIG. 1 by filling the insulating film 61 into the slits ST1; and the separation portion 62 is formed by filling the insulating film 61 into the slit ST2.

Figure 29:
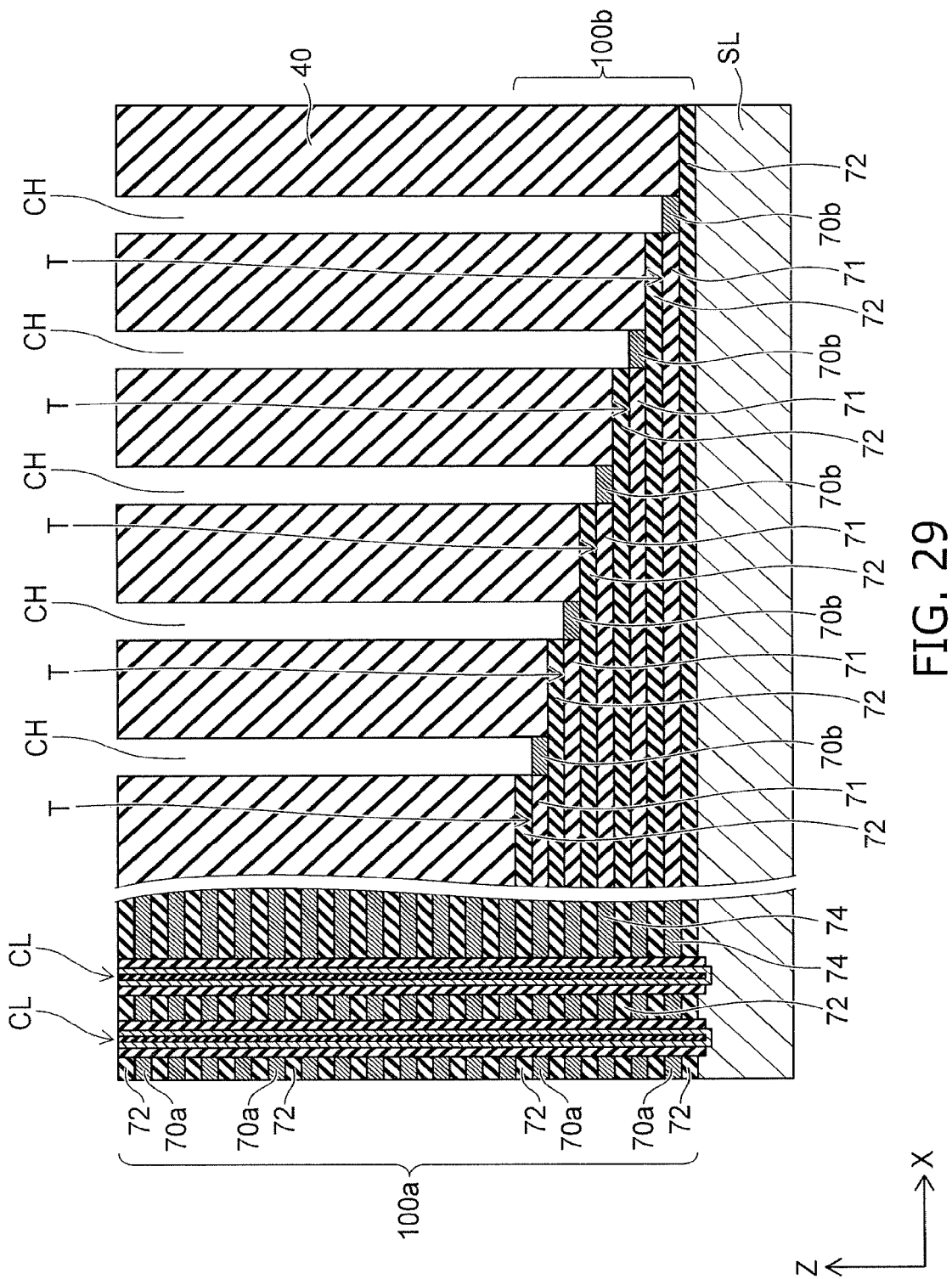

Subsequently, as shown in FIG. 29, multiple contact holes CH that pierce the inter-layer insulating film 40 and reach the first conductive portions 70b of the terrace portions T are formed by, for example, RIE. The contacts CC shown in FIG. 3 are formed inside the contact holes CH; and the contacts CC contact the first conductive portions 70b.

Figure 33A:
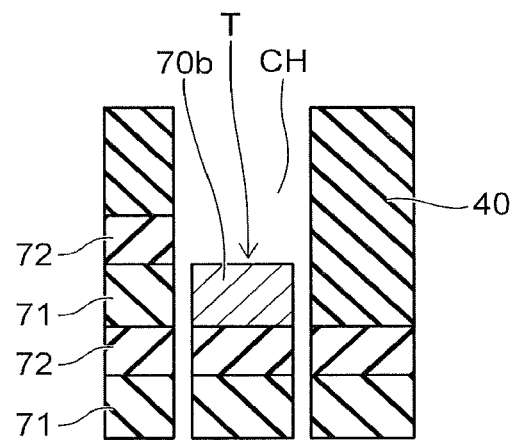
Figure 33B:
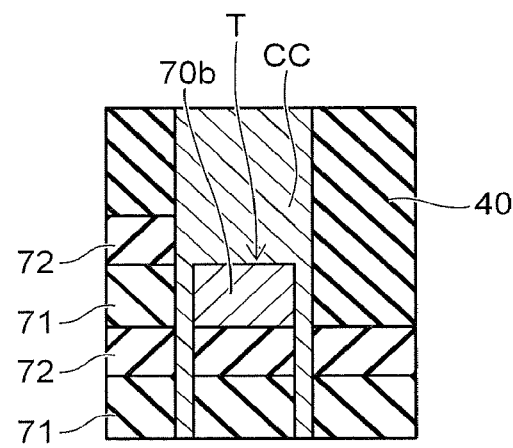

FIGS. 33A and 33B are schematic cross-sectional views showing another example of the method for forming the contact holes CH and the contacts CC.

In the case where the diameter of the contact hole CH is wider than the width of the first conductive portion 70b of the terrace portion T to be connected, the sacrificial layers (the spacer portions) 71 and the insulating layers 72 that are positioned at the portions lower than the upper surface of the first conductive portion 70b of the terrace portion T to be connected also may be etched when etching to form the contact hole CH. In such a case, as shown in FIG. 33A, a portion of the contact hole CH extends lower than the upper surface of the first conductive portion 70b; and as shown in FIG. 33B, the contact (the conductive material of a metal, etc.) CC is filled into the contact hole CH.

Accordingly, the contact CC extends lower than the upper surface of the first conductive portion 70b, and contacts the side surface of the first conductive portion 70b in addition to the upper surface of the first conductive portion 70b.

Because the spacer portions 71 are silicon nitride layers and are insulating bodies, the contact CC is not shorted to the first conductive portions 70b of the other layers even when the contact CC reaches the spacer portions 71 of the other layers lower than the first conductive portion 70b to be connected.

Because the level number changes one level at a time in the X-direction for the multiple terrace portions T arranged in the X-direction, the first conductive portions 70b are not formed in the other layers under the first conductive portion 70b to be connected. Accordingly, the contact CC that extends lower than the first conductive portion 70b to be connected is not shorted to the first conductive portions 70b of the other layers. However, the contact CC is formed not to contact the source layer SL shown in FIG. 2.

For example, according to the lithography precision or the size of the contact CC, there may be a case where the contact CC is not contained within the area of the terrace portion T to be connected as illustrated by the broken lines in FIG. 6B; and the contact CC also may drop down to the terrace portion T of one layer level below the terrace portion T to be connected.

Even in such a case, the contact CC is not shorted to the first conductive portions 70b of the other layers because the first conductive portions 70b of the other layers do not exist under the first conductive portion 70b at the formation position of the contact CC shown by the broken line in FIG. 6B, and because the spacer portions 71 and the insulating layers 72 which are insulating bodies are stacked.

However, because a structure is obtained in which the end of the lowermost level of the second column 92 (the end on the front side in FIG. 5) overlaps the multiple first conductive portions 70b with the insulating layers 72 interposed, the first conductive portions 70b of different layers may be shorted to each other via the contact CC if the contact CC is shifted from the terrace portion T of the lowermost level of the second column 92.

Accordingly, in the example shown in FIG. 6B, the terrace portion T that is in the same level as the terrace portion T of the uppermost level (the fifth level) of the first column 91 is disposed in the lowermost level of the second column 92 as a dummy; and the contact CC does not drop down to the first conductive portion 70b of the dummy terrace portion T. In the example shown in FIG. 6B, the first conductive portion 70b of the terrace portion T of the fifth level is connected to the contact CC disposed at the boundary between the fifth level and the fourth level of the first column 91.

Similarly, the contact CC is not disposed at the ends of the lowermost levels of the first column 93 and the second column 94 of the adjacent block 300. In the lowermost level of the first column 93, the terrace portion T that is in the same level as the terrace portion T of the uppermost level (the ninth level) of the second column 92 left-adjacent is disposed as a dummy. In the lowermost level of the second column 94, the terrace portion T that is in the same level as the terrace portion T of the uppermost level (the thirteenth level) of the first column 93 left-adjacent is disposed as a dummy.

By etching through the slits ST1, the insulating layers 72 that are between the multiple conductive layers 70a of the first stacked portion 100a may be removed; and an air gap may be provided between the multiple conductive layers 70a of the first stacked portion 100a. In such a case, the multiple conductive layers 70a stacked with the air gap interposed are supported by the multiple columnar portions CL.

By causing at least a portion of the insulating layers 72 to remain in the second stacked portion 100b in which the columnar portions are not disposed, the multiple layers separated vertically and including the conductive portions 70b, 70c and the spacer portions 71 can be supported.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a stacked body including a plurality of conductive layers stacked with an insulator interposed there between, the stacked body including a first stacked portion and a second stacked portion, the second stacked portion including a plurality of terrace portions, each terrace portion having a different level to an adjacent terrace portion in a first direction and having a different level to an adjacent terrace portion in a second direction, the second direction crossing the first direction;
   a columnar portion extending in a stacking direction of the stacked body through the first stacked portion;

a plurality of first separation portions piercing the first stacked portion, extending in the first direction, and dividing the first stacked portion into a plurality of first blocks in the second direction; and a plurality of second separation portions piercing the second stacked portion, extending in the first direction, and dividing the second stacked portion into a plurality of second blocks in the second direction, at least one of the terrace portions in the second stacked portion including a layer containing a conductive area and a spacer area which are not overlapped with each other in a view from the stacking direction, the conductive area being continuous to one of the conductive layers of the first stacked portion and formed of a same material as that of the conductive layers, and the spacer area being formed of a material different from that of the conductive area, one of the second blocks between two of the second separation portions adjacent to each other in the second direction including:

a first column including the terrace portions arranged in the first direction and adjacent to one second separation portion of the two second separation portions; and a second column including the terrace portions arranged in the first direction and adjacent to the first column and the other second separation portion of the two second separation portions, the terrace portions of the second column being disposed in a level equal to or higher than an uppermost level of the terrace portions of the first column, the conductive area including:

a first conductive area provided at an end in the first direction of one of the terrace portions; and a second conductive area extending in the first direction along an edge in the second direction of one of the terrace portions and connecting the first conductive area and the conductive layer of the first stacked portion, the terrace portions of the first column each including one second conductive area provided at a boundary with the one second separation portion, and the terrace portions of the second column each including two second conductive portions provided at a boundary with the other second separation portion and a boundary with the first column.

2. The device according to claim 1, wherein the spacer area is an insulating area.

3. The device according to claim 1, wherein
the insulator is a silicon oxide layer, and
the spacer area is a silicon nitride layer.

4. The device according to claim 1, wherein the conductive area includes an L-shaped area along the first direction and the second direction.

5. The device according to claim 1, further comprising:
an inter-layer insulating film provided on the second stacked portion; and
a plurality of contacts extending in the stacking direction through the inter-layer insulating film and reaching the terrace portions, one of the contacts contacting the conductive area of one of the terrace portions.

6. The device according to claim 5, wherein
the conductive area includes:
    a first conductive area provided at an end in the first direction of one of the terrace portions, one of the contacts contacting the first conductive area; and
    a second conductive area extending in the first direction along an edge in the second direction of one of the terrace portions and connecting the first conductive area and the conductive layer of the first stacked portion.

7. The device according to claim 1, wherein number of the terrace portions of the first column and number of the terrace portions of the second column are same.

8. The device according to claim 1, wherein
a level number changes one level at a time in the first direction for the terrace portions of the first column,
a level number changes one level at a time in the first direction for the terrace portions of the second column, and
the terrace portion of a lowermost level of the second column is positioned at a same level as the terrace portion of an uppermost level of the first column.

9. The device according to claim 5, wherein
the spacer area is an insulating area,
a level number changes one level at a time in the first direction for the terrace portions arranged in the first direction, and
one of the contacts extends to be lower than an upper surface of the conductive area of one of the terrace portions and contacts a side surface of the conductive area.

10. The device according to claim 1, wherein
the columnar portion includes:
    a semiconductor body extending in the stacking direction; and
    a charge storage portion provided between the semiconductor body and one of the conductive layers.

* * * * *